(12) United States Patent
Yamazaki et al.

(10) Patent No.: US 8,497,628 B2
(45) Date of Patent: *Jul. 30, 2013

(54) LIGHT EMITTING DEVICE AND MANUFACTURING METHOD OF THE SAME

(75) Inventors: Shunpei Yamazaki, Tokyo (JP); Satoshi Seo, Kanagawa (JP); Hideaki Kuwabara, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/279,478

(22) Filed: Oct. 24, 2011

(65) Prior Publication Data

US 2012/0098013 A1     Apr. 26, 2012

Related U.S. Application Data

(60) Continuation of application No. 12/157,594, filed on Jun. 11, 2008, now Pat. No. 8,044,580, which is a division of application No. 10/422,380, filed on Apr. 24, 2003, now Pat. No. 7,402,948.

(30) Foreign Application Priority Data

Apr. 26, 2002  (JP) ................................ 2002-125970

(51) Int. Cl.
    *H05B 33/00*     (2006.01)
(52) U.S. Cl.
    USPC ............ 313/504; 313/506; 313/112; 428/917
(58) Field of Classification Search
    None
    See application file for complete search history.

(56) References Cited

U.S. PATENT DOCUMENTS 4,411,735 A   10/1983   Belani
5,047,687 A    9/1991   VanSlyke (Continued)

FOREIGN PATENT DOCUMENTS

EP   0 717 445 A2   6/1996
EP   0 781 075 A1   6/1997

(Continued)

OTHER PUBLICATIONS

Kamins, T., *Polycrystalline Silicon for Integrated Circuits and Displays*, 2nd ed., Kluwer Academic Publishers, 1998, pp. 301-302.

(Continued)

*Primary Examiner* — Ashok Patel
(74) *Attorney, Agent, or Firm* — Husch Blackwell LLP

(57) ABSTRACT

The present invention is directed to a light emitting device structured so as to increase the amount of light which is taken out in a certain direction after emitted from a light emitting element, and a method of manufacturing this light emitting device. An upper end portion of an insulating material 19 that covers an end portion of a first electrode 18 is formed to have a curved surface having a radius of curvature, a second electrode 23a is formed to have a slant face as going from its center portion toward its end portion along the curved surface. Light emitted from a light emitting layer comprising an organic material 20 that is formed on the second electrode 23a is reflected at the slant face of the second electrode 23a to increase the total amount of light taken out in the direction indicated by the arrow in FIG. 1A.

42 Claims, 11 Drawing Sheets

U.S. PATENT DOCUMENTS

| | | |
|---|---|---|
| 5,049,780 A | 9/1991 | Dobrowolski et al. |
| 5,063,327 A | 11/1991 | Brodie et al. |
| 5,232,549 A | 8/1993 | Cathey et al. |
| 5,640,067 A | 6/1997 | Yamauchi et al. |
| 5,684,365 A | 11/1997 | Tang et al. |
| 5,742,129 A | 4/1998 | Nagayama et al. |
| 5,786,664 A | 7/1998 | Liu |
| 5,839,456 A | 11/1998 | Han |
| 5,962,962 A | 10/1999 | Fujita et al. |
| 6,037,712 A | 3/2000 | Codama et al. |
| 6,091,195 A | 7/2000 | Forrest et al. |
| 6,107,158 A | 8/2000 | Zheng et al. |
| 6,114,715 A | 9/2000 | Hamada |
| 6,136,624 A | 10/2000 | Kemmochi et al. |
| 6,194,837 B1 | 2/2001 | Ozawa |
| 6,222,315 B1 | 4/2001 | Yoshizawa et al. |
| 6,306,559 B1 | 10/2001 | Tanamura et al. |
| 6,320,311 B2 | 11/2001 | Nakaya et al. |
| 6,380,687 B1 | 4/2002 | Yamazaki |
| 6,384,427 B1 | 5/2002 | Yamazaki et al. |
| 6,396,208 B1 | 5/2002 | Oda et al. |
| 6,403,289 B1 | 6/2002 | Tanaka et al. |
| 6,406,804 B1 | 6/2002 | Higashi et al. |
| 6,420,834 B2 | 7/2002 | Yamazaki et al. |
| 6,432,845 B1 | 8/2002 | Morozumi |
| 6,433,487 B1 | 8/2002 | Yamazaki |
| 6,441,873 B2 | 8/2002 | Young |
| 6,445,005 B1 | 9/2002 | Yamazaki et al. |
| 6,456,003 B1 | 9/2002 | Mori et al. |
| 6,462,722 B1 | 10/2002 | Kimura et al. |
| 6,475,836 B1 | 11/2002 | Suzawa et al. |
| 6,501,217 B2 | 12/2002 | Beierlein et al. |
| 6,515,310 B2 | 2/2003 | Yamazaki et al. |
| 6,518,700 B1 | 2/2003 | Friend et al. |
| 6,522,315 B2 | 2/2003 | Ozawa et al. |
| 6,528,824 B2 | 3/2003 | Yamagata et al. |
| 6,538,374 B2 | 3/2003 | Hosokawa |
| 6,538,390 B2 | 3/2003 | Fujita et al. |
| 6,552,496 B2 | 4/2003 | Yamazaki |
| 6,555,968 B2 | 4/2003 | Yamazaki et al. |
| 6,597,111 B2 | 7/2003 | Silvernail et al. |
| 6,597,121 B2 | 7/2003 | Imura |
| 6,599,783 B2 | 7/2003 | Takatoku |
| 6,605,826 B2 | 8/2003 | Yamazaki et al. |
| 6,608,353 B2 | 8/2003 | Miyazaki et al. |
| 6,608,449 B2 | 8/2003 | Fukunaga |
| 6,614,085 B2 | 9/2003 | Hu |
| 6,614,174 B1 | 9/2003 | Urabe et al. |
| 6,618,029 B1 | 9/2003 | Ozawa |
| 6,624,571 B1 | 9/2003 | Toyoyasu et al. |
| 6,628,065 B2 | 9/2003 | Araki et al. |
| 6,639,265 B2 | 10/2003 | Arao et al. |
| 6,641,933 B1 | 11/2003 | Yamazaki et al. |
| 6,689,492 B1 | 2/2004 | Yamazaki et al. |
| 6,690,034 B2 | 2/2004 | Fujimoto et al. |
| 6,692,845 B2 | 2/2004 | Maruyama et al. |
| 6,699,739 B2 | 3/2004 | Yamazaki et al. |
| 6,717,181 B2 | 4/2004 | Murakami et al. |
| 6,720,572 B1 | 4/2004 | Jackson et al. |
| 6,737,306 B2 | 5/2004 | Yamazaki et al. |
| 6,739,931 B2 | 5/2004 | Yamazaki et al. |
| 6,740,457 B2 | 5/2004 | Takizawa |
| 6,750,618 B2 | 6/2004 | Yamazaki et al. |
| 6,768,259 B2 | 7/2004 | Hirano |
| 6,768,534 B2 | 7/2004 | Iwase et al. |
| 6,774,573 B2 | 8/2004 | Yamazaki |
| 6,787,796 B2 | 9/2004 | Do et al. |
| 6,788,356 B2 | 9/2004 | Song |
| 6,798,132 B2 | 9/2004 | Satake |
| 6,805,977 B2 | 10/2004 | Sotoyama et al. |
| 6,819,045 B2 * | 11/2004 | Okita et al. ............ 313/511 |
| 6,831,408 B2 | 12/2004 | Hirano et al. |
| 6,839,045 B2 | 1/2005 | Ozawa et al. |
| 6,853,130 B2 | 2/2005 | Morii |
| 6,858,878 B2 | 2/2005 | Yamazaki et al. |
| 6,869,635 B2 | 3/2005 | Kobayashi |
| 6,881,501 B2 | 4/2005 | Yudasaka |
| 6,894,312 B2 | 5/2005 | Yamazaki et al. |
| 6,933,672 B2 | 8/2005 | Hosokawa |
| 6,956,324 B2 | 10/2005 | Yamazaki |
| 6,958,490 B2 | 10/2005 | Okamoto et al. |
| 6,969,291 B2 | 11/2005 | Urabe et al. |
| 6,977,463 B2 | 12/2005 | Sato |
| 6,995,511 B2 | 2/2006 | Yamazaki et al. |
| 7,015,503 B2 | 3/2006 | Seki et al. |
| 7,098,602 B2 | 8/2006 | Yamazaki et al. |
| 7,112,374 B2 | 9/2006 | Yamazaki et al. |
| 7,122,254 B2 | 10/2006 | Beierlein et al. |
| 7,138,762 B2 | 11/2006 | Morii |
| 7,180,483 B2 | 2/2007 | Kimura et al. |
| 7,187,121 B2 | 3/2007 | Hasegawa et al. |
| 7,190,111 B2 | 3/2007 | Lee et al. |
| 7,214,959 B2 | 5/2007 | Seki et al. |
| 7,221,339 B2 | 5/2007 | Ozawa et al. |
| 7,253,793 B2 | 8/2007 | Ozawa et al. |
| 7,256,422 B2 | 8/2007 | Yamazaki |
| 7,273,801 B2 | 9/2007 | Seki et al. |
| 7,301,276 B2 | 11/2007 | Yamazaki et al. |
| 7,332,859 B2 | 2/2008 | Hasegawa et al. |
| 7,358,531 B2 | 4/2008 | Koyama |
| 7,402,945 B2 | 7/2008 | Yamazaki et al. |
| 7,402,948 B2 | 7/2008 | Yamazaki et al. |
| 7,427,832 B2 | 9/2008 | Kobayashi |
| 7,482,182 B2 | 1/2009 | Yamazaki et al. |
| 7,548,027 B2 | 6/2009 | Yamazaki |
| 7,579,771 B2 | 8/2009 | Yamazaki et al. |
| 7,663,305 B2 | 2/2010 | Yamazaki et al. |
| 7,723,179 B2 | 5/2010 | Yamazaki et al. |
| 7,786,496 B2 | 8/2010 | Yamazaki et al. |
| 2001/0011868 A1 | 8/2001 | Fukunaga et al. |
| 2001/0013913 A1 | 8/2001 | Young |
| 2001/0020922 A1 | 9/2001 | Yamazaki et al. |
| 2001/0026125 A1 | 10/2001 | Yamazaki et al. |
| 2001/0046003 A1 | 11/2001 | Song |
| 2001/0054867 A1 | 12/2001 | Kubota |
| 2002/0011597 A1 | 1/2002 | Fujimoto et al. |
| 2002/0025643 A1 | 2/2002 | Akram et al. |
| 2002/0039730 A1 | 4/2002 | Morii |
| 2002/0043932 A1 | 4/2002 | Kawashima |
| 2002/0047509 A1 | 4/2002 | Araki et al. |
| 2002/0050795 A1 | 5/2002 | Imura |
| 2002/0063287 A1 | 5/2002 | Yamazaki et al. |
| 2002/0063515 A1 | 5/2002 | Goto |
| 2002/0121860 A1 | 9/2002 | Seo et al. |
| 2002/0145582 A1 * | 10/2002 | Yamazaki et al. .............. 345/92 |
| 2003/0062826 A1 | 4/2003 | Seo et al. |
| 2003/0082465 A1 | 5/2003 | Takizawa |
| 2003/0193493 A1 | 10/2003 | Ozawa |
| 2003/0197466 A1 | 10/2003 | Yamazaki et al. |
| 2003/0201447 A1 | 10/2003 | Yamazaki et al. |
| 2003/0201716 A1 | 10/2003 | Yamazaki et al. |
| 2003/0222575 A1 | 12/2003 | Yamazaki et al. |
| 2003/0227021 A1 | 12/2003 | Yamazaki et al. |
| 2003/0231273 A1 | 12/2003 | Kimura et al. |
| 2004/0012747 A1 | 1/2004 | Yamazaki et al. |
| 2004/0171182 A1 | 9/2004 | Yamazaki et al. |
| 2004/0195964 A1 | 10/2004 | Yamazaki et al. |
| 2005/0001541 A1 | 1/2005 | Yamazaki et al. |
| 2005/0006667 A1 | 1/2005 | Yamazaki |
| 2005/0012445 A1 | 1/2005 | Yamazaki et al. |
| 2005/0073243 A1 | 4/2005 | Yamazaki et al. |
| 2005/0134171 A1 | 6/2005 | Kobayashi |
| 2005/0162092 A1 | 7/2005 | Yamazaki et al. |
| 2005/0186403 A1 | 8/2005 | Seki et al. |
| 2005/0247938 A1 | 11/2005 | Okamoto et al. |
| 2005/0248266 A1 | 11/2005 | Hosokawa |
| 2006/0014465 A1 | 1/2006 | Yamazaki |
| 2006/0017374 A1 | 1/2006 | Hasegawa et al. |
| 2006/0082300 A1 | 4/2006 | Yamazaki et al. |
| 2006/0267030 A1 | 11/2006 | Yamazaki et al. |
| 2006/0273995 A1 | 12/2006 | Ozawa et al. |
| 2006/0273996 A1 | 12/2006 | Ozawa et al. |
| 2006/0279491 A1 | 12/2006 | Ozawa et al. |
| 2007/0007870 A1 | 1/2007 | Yamazaki et al. |
| 2007/0096641 A1 | 5/2007 | Hasegawa et al. |

| | | | |
|---|---|---|---|
| 2008/0258617 | A1 | 10/2008 | Kobayashi |
| 2009/0298377 | A1 | 12/2009 | Yamazaki et al. |
| 2010/0221855 | A1 | 9/2010 | Yamazaki et al. |

FOREIGN PATENT DOCUMENTS

| | | |
|---|---|---|
| EP | 0 895 219 A1 | 2/1999 |
| EP | 0 917 127 A1 | 5/1999 |
| EP | 0 989 778 A1 | 3/2000 |
| EP | 1 022 931 A1 | 7/2000 |
| EP | 1 065 723 A2 | 1/2001 |
| EP | 1 085 576 A2 | 3/2001 |
| EP | 1 087 448 A2 | 3/2001 |
| EP | 1 191 820 A1 | 3/2002 |
| EP | 1 191 823 A1 | 3/2002 |
| EP | 1 255 240 A1 | 11/2002 |
| EP | 1 336 953 A2 | 8/2003 |
| EP | 1 337 131 A2 | 8/2003 |
| EP | 1 359 789 A1 | 11/2003 |
| EP | 1 363 265 A2 | 11/2003 |
| EP | 1 619 654 A1 | 1/2006 |
| EP | 1 793 650 A2 | 6/2007 |
| EP | 1 830 342 A2 | 9/2007 |
| EP | 1 830 343 A2 | 9/2007 |
| EP | 1 830 344 A2 | 9/2007 |
| JP | 9-63771 | 3/1997 |
| JP | 10-289784 | 10/1998 |
| JP | 11-307264 | 11/1999 |
| JP | 11-329741 | 11/1999 |
| JP | 11-339970 | 12/1999 |
| JP | 2000-21566 | 1/2000 |
| JP | 2000-77181 | 3/2000 |
| JP | 2000-91083 | 3/2000 |
| JP | 2000-193994 | 7/2000 |
| JP | 2000-269473 | 9/2000 |
| JP | 2001-43980 | 2/2001 |
| JP | 2001-43981 | 2/2001 |
| JP | 2001-52870 | 2/2001 |
| JP | 2001-76868 | 3/2001 |
| JP | 2001-154001 | 6/2001 |
| JP | 2001-230086 | 8/2001 |
| JP | 2001-338771 | 12/2001 |
| JP | 2001-351787 | 12/2001 |
| JP | 2002-8566 | 1/2002 |
| JP | 2002-15859 | 1/2002 |
| JP | 2002-15860 | 1/2002 |
| JP | 2002-71902 | 3/2002 |
| JP | 2002-93586 | 3/2002 |
| JP | 2002-132186 | 5/2002 |
| JP | 2002-198182 | 7/2002 |
| JP | 2002-208491 | 7/2002 |
| JP | 2002-352963 | 12/2002 |
| JP | 2003-017272 | 1/2003 |
| JP | 2003-17273 | 1/2003 |
| JP | 2003-303684 | 10/2003 |
| WO | WO 99/39393 A1 | 8/1999 |
| WO | WO 99/43028 A1 | 8/1999 |
| WO | WO 99/59379 A2 | 11/1999 |
| WO | WO 00/16361 A1 | 3/2000 |
| WO | WO 01/08240 A1 | 2/2001 |
| WO | WO 01/63975 A1 | 8/2001 |

OTHER PUBLICATIONS

*Merriam-Webster's Collegiate Dictionary*, 10$^{th}$ edition, 1998, p. 827.
*Merriam-Webster's Collegiate Dictionary*, 10$^{th}$ edition, 1998, p. 653.
Adamovich, V. et al, "TiN as an Anode Material for Organic Light-Emitting Diodes," Advanced Materials, vol. 11, No. 9, 1999, pp. 727-730.
Pending Claims re U.S. Appl. No. 10/419,640 (Election and Amendment A), dated Oct. 6, 2004.
Pending Claims re U.S. Appl. No. 10/421,238 (Amendment B after Final), dated Sep. 9, 2005.
Pending Claims re U.S. Appl. No. 10/379,123 (Amendment A), dated Oct. 21, 2005.

* cited by examiner

LIGHT EMITTING REGION

A-A' CROSS-SECTIONAL VIEW

A-A' CROSS-SECTIONAL VIEW

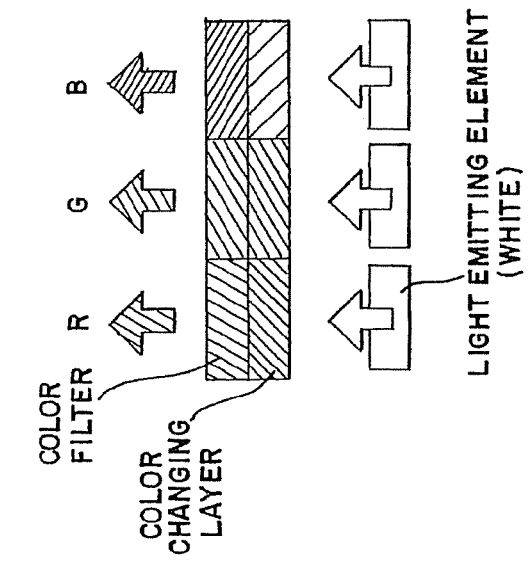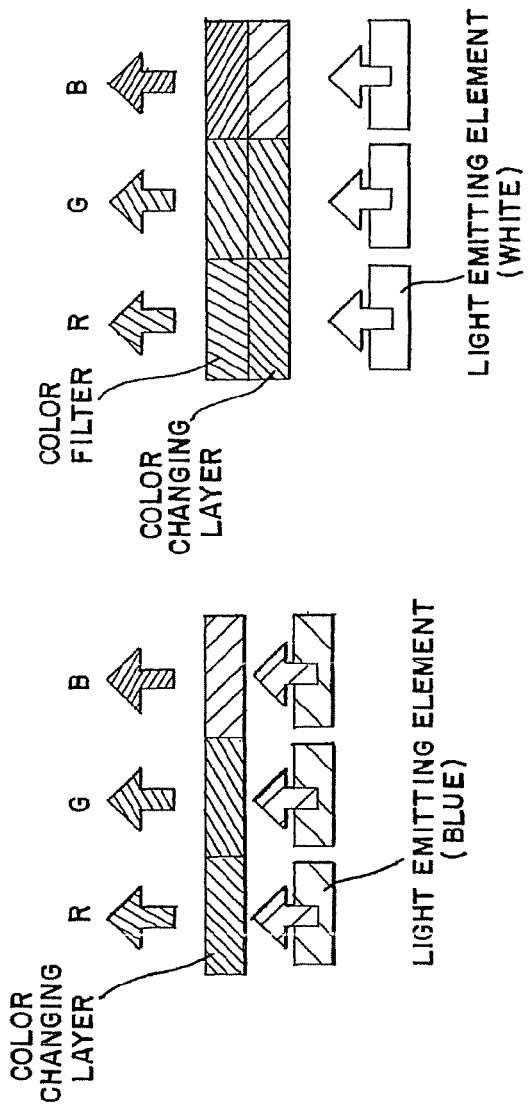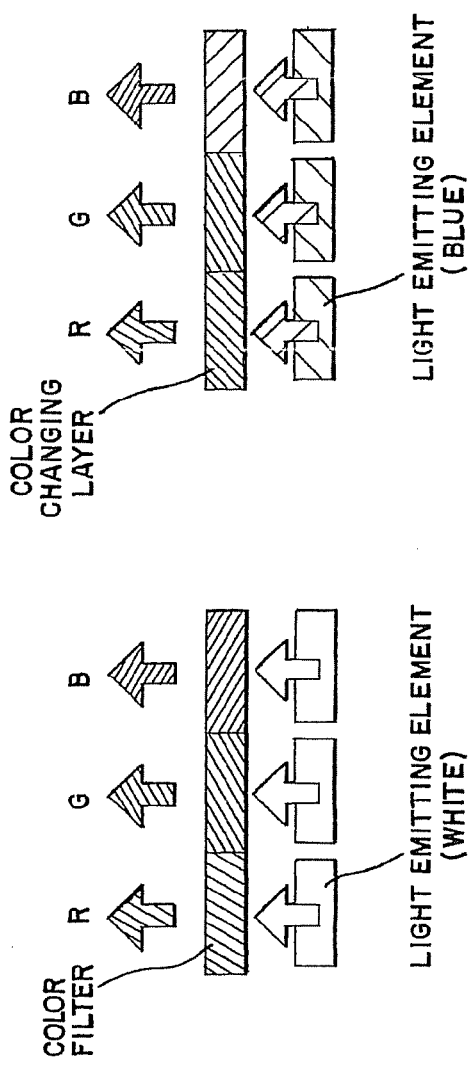

LIGHT EMITTING REGION

A-A' CROSS-SECTIONAL VIEW

LIGHT EMITTING REGION

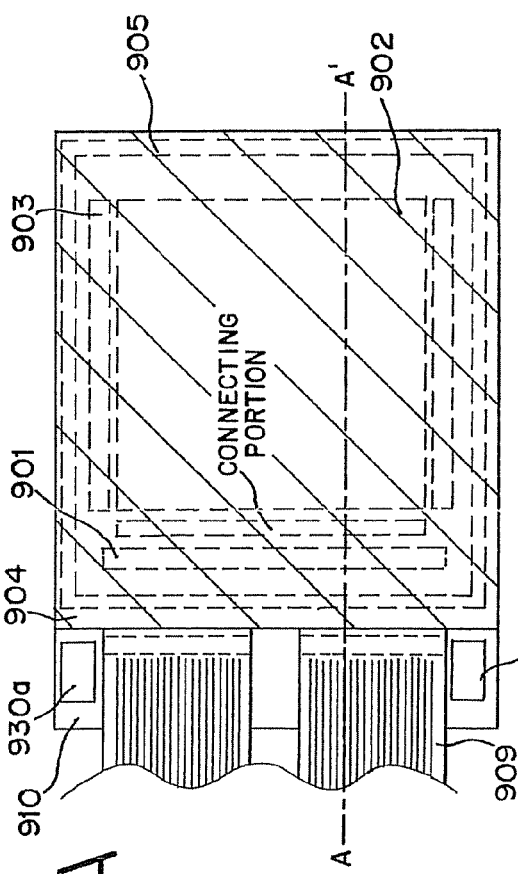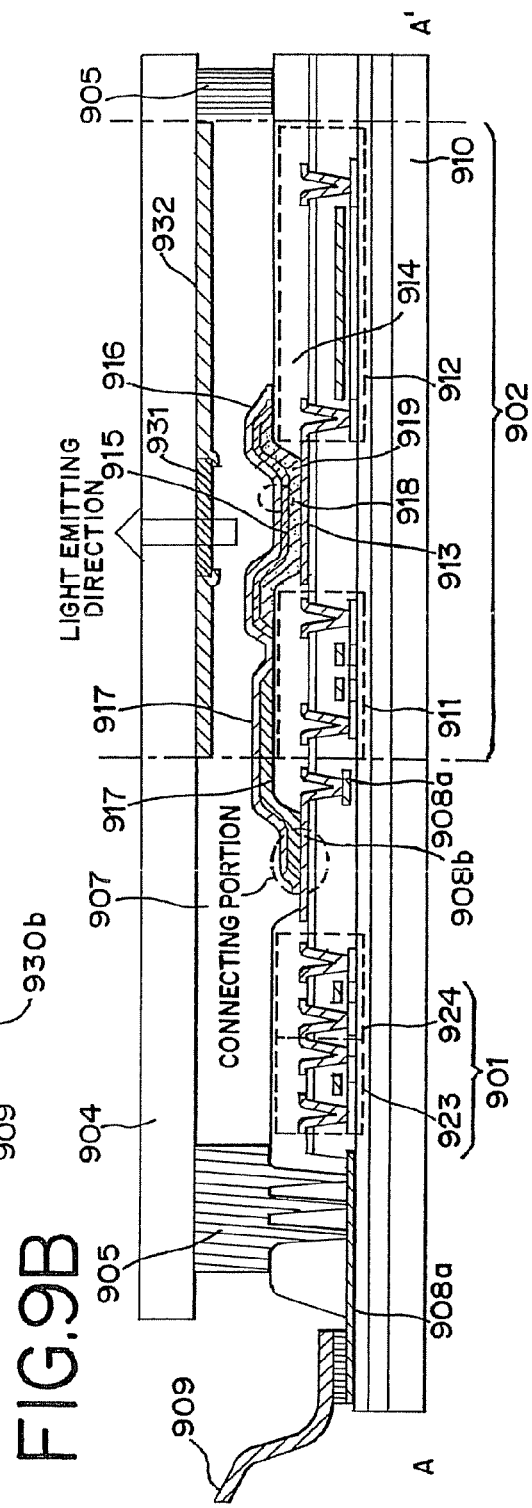
FIG.9A
FIG.9B

LIGHT EMITTING DEVICE AND MANUFACTURING METHOD OF THE SAME

This application is a continuation of U.S. application Ser. No. 12/157,594, filed on Jun. 11, 2008 now U.S. Pat. No. 8,044,588 which is a divisional of U.S. application Ser. No. 10/422,380, filed on Apr. 24, 2003 (now U.S. Pat. No. 7,402,948 issued Jul. 22, 2008).

BACKGROUND OF THE INVENTION

1. Field of the Invention

The present invention relates to a light emitting device with a light emitting element that emits fluorescent light or phosphorescent light upon application of electric field to a pair of electrodes of the element which sandwich a organic compound-containing layer (hereinafter, a light emitting layer comprising an organic material), and to a method of manufacturing the light emitting device. In this specification, the term light emitting device includes an image display device, a light emitting device and a light source (including illuminating device). Also, the following modules are included in the definition of the light emitting device: a module obtained by attaching to a light emitting device a connector such as an FPC (flexible printed circuit; terminal portion), a TAB (tape automated bonding) tape, or a TCP (tape carrier package); a module in which a printed wiring board is provided at an end of the TAB tape or the TCP; and a module in which an IC (integrated circuit) is directly mounted to a light emitting element by the COG (chip on glass) system.

2. Description of the Related Art

Light emitting elements, which employ organic compounds as light emitting member and are characterized by their thinness and light-weight, fast response, and direct current low voltage driving, are expected to develop into next-generation flat panel displays. Among display devices, ones having light emitting elements arranged to form a matrix shape are considered to be particularly superior to the conventional liquid crystal display devices for their wide viewing angle and excellent visibility.

It is said that light emitting elements emit light through the following mechanism: a voltage is applied between a pair of electrodes that sandwich a light emitting layer comprising an organic material, electrons injected from the cathode and holes injected from the anode are re-combined at the luminescent center of the light emitting layer comprising the organic material to form molecular excitons, and the molecular excitons return to the base state while releasing energy to cause the light emitting element to emit light. Known as excitation states are singlet excitation and triplet excitation, and it is considered that luminescence can be conducted through either one of those excitation states.

Such light emitting devices having light emitting elements arranged to form a matrix can employ passive matrix driving (simple matrix light emitting devices), active matrix driving (active matrix light emitting devices), or other driving methods. However, if the pixel density is increased, active matrix light emitting devices in which each pixel (or each dot) has a switch are considered as advantageous because they can be driven with low voltage.

Organic compounds for forming a layer containing an organic compound (strictly speaking, light emitting layer), which is the main part of a light emitting element, are classified into low molecular weight materials and polymeric (polymer) materials. Both types of materials are being studied but polymeric materials are the ones that are attracting attention because they are easier to handle and have higher heat resistance than low molecular weight materials.

The conventional active matrix type light emitting device has the structure comprising a light emitting element in which an electrode electrically connected with TFT on a substrate is formed as an anode, a light emitting layer comprising an organic material is formed thereon, and cathode is formed thereon. And light generated at the light emitting layer comprising the organic material can be observed at the TFT side through the anode that is a transparent electrode.

Therefore, manufactured in the present invention is an active matrix light emitting device that has a light emitting element with a structure called a top emission structure. In the top emission structure, a TFT side electrode which is electrically connected to a TFT on a substrate serves as an anode, a light emitting layer comprising an organic material is formed on the anode, and a cathode that is a transparent electrode is formed on the light emitting layer comprising the organic material. Or, an active matrix light emitting device that has a light emitting element with the structure in which the first electrode serves as a cathode, a light emitting layer comprising an organic material formed on the cathode, and an anode that is a transparent second electrode formed on the light emitting layer comprising the organic material is formed.

Not all of light generated in the light emitting layer comprising the organic material cannot be observed by observers through the transparent electrode serving as the cathode. For example, light emitted in the lateral direction (the direction parallel to the substrate face) is not taken out and therefore is a loss. An object of the present invention is to provide a light emitting device structured so as to increase the amount of light which is taken out in a certain direction after emitted from a light emitting element, as well as a method of manufacturing this light emitting device.

SUMMARY OF THE INVENTION

A problem of the top emission structure is that its transparent electrode has high film resistance. The film resistance becomes higher when the thickness of the transparent electrode is reduced. When the transparent electrode that serves as an anode or a cathode is high in film resistance, a voltage drop makes the intra-plane electric potential distribution uneven and the luminance becomes fluctuated among light emitting elements. Another object of the present invention is therefore to provide a light emitting device structured so as to lower the film resistance of a transparent electrode in a light emitting element, as well as a method of manufacturing the light emitting device. Still another object of the present invention is to provide an electric appliance that uses this light emitting device as its display unit.

In the present invention, the first electrode is formed, and insulating materials (also referred to as a bank or a partition wall) that cover edges of the first electrode, and then, the second electrode is formed to contact with the curved surface of the insulating materials. A light emitting layer comprising an organic material and a cathode are formed on a concave shaped second electrode. The second electrode functions as an anode and is for increasing the amount of light taken out in a certain direction (a direction in which light passes the cathode) by reflecting light emitted in the lateral direction.

Accordingly, the top layer of the second electrode having a slant is preferably made from a metal that reflects light, for example, a material mainly containing aluminum or silver, whereas the center portion that is in contact with the light emitting layer comprising the organic material is formed of an anode material having a large work function or a cathode material having a small work function.

Further, the present invention is for reducing the film resistance of a transparent electrode that serves as a cathode by means of forming wirings (auxiliary wirings) on the insulating materials provided between each pixel electrode simultaneously with a formation of the second electrode. In addition, the present invention also has a characteristic of forming outgoing wirings using the auxiliary wirings to connect with another wirings that are in a bottom layer.

A structure 1 of the invention that is related to a manufacturing method disclosed in this specification is that a light emitting device possessing plural light emitting elements each having, on a substrate possessing insulation surfaces, a first electrode connected to a source region or a drain region of a thin film transistor, an insulating material covering an end portion of the first electrode, a second electrode covering a side face or a part of the side face of the insulating material and contacting with the first electrode, a organic compound-containing layer contacting with the second electrode, and a third electrode contacting with the layer.

Further, in the above structure, it is preferable that an auxiliary electrode is formed simultaneously with forming the second electrode in order to reduce the resistance of an upper electrode (the third electrode).

A structure 2 of the another invention is that a light emitting device possessing plural light emitting elements each having, on a substrate possessing insulation surfaces, a first electrode connected to a source region or a drain region of a thin film transistor, an insulating material covering an end portion of the first electrode, a second electrode covering a side face or a part of the side face of the insulating material and contacting with the first electrode, a organic compound-containing layer contacting with the second electrode, a third electrode contacting with the layer, and an auxiliary electrode contacting with the third electrode on the insulating material and becoming the same electric potential, wherein the auxiliary electrode is the same material as the second electrode.

A light emitting device in the above each structure, wherein the first electrode is the same in its electric potential as the second electrode, and is an anode or a cathode.

A light emitting device in above each structure, wherein the second electrode is formed in a concave shape partially having a curved surface as going from its center portion toward its end portion, and reflects a light emitted from the light emitting layer comprising the organic material.

A light emitting device in the above each structure, wherein the center portion of the second electrode contacts with the first electrode, and the insulating material exists between an end portion of the first electrode and an end portion of the second electrode.

A light emitting device in above each structure, wherein the third electrode is a conductive film through which a light is transmitted.

The present invention gives an insulating material placed between pixels (called as a bank, a partition wall, a barrier or the like) a particular shape to avoid insufficient coverage when forming by application a high molecular weight organic compound-containing layer. The above structures are characterized in that an upper edge portion of the insulating material is curved to have the first radius of curvature, and a bottom edge portion of the insulating material is curved to have the second radius of curvature. The first radius of curvature and the second radius of curvature are 0.2 to 3 μm. The taper angle of the insulating material is 35 to 55°.

By giving the edge the radius of curvature, the level difference is well covered and the light emitting layer comprising the organic material and other films formed on the insulating material can be made very thin.

The above structures are characterized in that the second electrode has a slant face toward its center and that the angle of inclination (also called as a taper angle) exceeds 30° and smaller than 70°, preferably, smaller than 60°. The angle of inclination, the material and thickness of the light emitting layer comprising the organic material, and the material and thickness of the third electrode have to be set suitably to prevent light reflected by the slant of the second electrode from scattering or straying between layers.

The above structures are characterized in that the second electrode is a conductive film transmissive of light, for example, a thin metal film, a transparent conductive film, or a laminated film having those films.

The stepped portion (the upper edge portion of the slant portion) of the second electrode is almost flush with a side face of the insulating material and, in order to cover the level difference well, it is preferable for the slant face of the second electrode and the side face of the insulating material to have the same angle of inclination.

The above structures are characterized in that the second electrode is an anode whereas the third electrode is a cathode. Alternatively, the above structures are characterized in that the second electrode is a cathode whereas the third electrode is an anode.

The light emitting device in each of the above structures is characterized in that the light emitting layer comprising the organic material is formed of a material that emits white light and that the layer is used in combination with color filters provided in a sealing member. Alternatively, the light emitting device in each of the above structures is characterized in that the light emitting layer comprising the organic material is formed of a material that emits light of a single color and that the layer is used in combination with color conversion layers or colored layers provided in a sealing member.

A structure for realizing the above each structure 1 and 2 is that a method of manufacturing a light emitting device possessing light emitting elements each having an anode, a organic compound-containing layer contacting with the anode, and a cathode contacting with the light emitting layer comprising the organic material, having the steps of:

forming an insulating material covering an end portion of a first electrode connected to a source region or a drain region of a thin film transistor, forming a second electrode contacting with a side face of the insulating material and the first electrode, and an auxiliary electrode onto the insulating material, forming a organic compound-containing layer contacting with a region of the second electrode contacting with the first electrode and a slant face of the second electrode, and forming onto the light emitting layer comprising the organic material a third electrode comprising a metal thin film through which a light is transmitted.

The above structure related to a manufacturing method is characterized in that the second electrode is an anode and is formed of a metal layer that is larger in work function than the third electrode. In addition, the above structure related to a manufacturing method is characterized in that the second electrode is a laminate of a first metal layer containing aluminum, a second metal layer containing titanium nitride or tungsten nitride. When titanium nitride or tungsten nitride is used for an anode, it is preferable to conduct ultraviolet ray irradiation treatment to raise its work function.

The above structures are characterized in that the second electrode has a slant portion toward its center and that the angle of inclination exceeds 30° and smaller than 70°.

The above structure related to a manufacturing method is characterized in that an upper edge portion of the insulating material for covering the edge portion of the first electrode is curved to have a radius of curvature and that the radius of curvature is 0.2 to 3 µm.

An EL element has a light emitting layer comprising an organic material that provides luminescence upon application of electric field (electro luminescence) (hereinafter, EL layer), in addition to an anode and a cathode. Luminescence obtained from organic compounds is divided into light emission upon return to the base state from singlet excitation (fluorescence) and light emission upon return to the base state from triplet excitation (phosphorescence). Both types of light emission can be employed in a light emitting device manufactured in accordance with a manufacturing device and a film-forming method of the present invention.

A light emitting element having an EL layer (EL element) is structured so as to sandwich the EL layer between a pair of electrodes. Usually, the EL layer has a laminate structure. A typical example of the laminate structure is one consisting of a hole transporting layer, a light emitting layer, and an electron transporting layer, which was proposed by Tang et al. of Kodak Eastman Company. This structure has very high light emission efficiency and is employed in most of light emitting devices that are currently under development.

Other examples of the laminate structure include one in which a hole injection layer, a hole transporting layer, a light emitting layer, and an electron transporting layer are layered on an anode in this order, and one in which a hole injection layer, a hole transporting layer, a light emitting layer, an electron transporting layer, and an electron injection layer are layered on an anode in this order. The light emitting layer may be doped with a fluorescent pigment or the like. These layers may all be formed of low molecular weight materials or may all be formed of high molecular weight materials. In this specification, all layers placed between an anode and a cathode together make an EL layer. Accordingly, the above hole injection layer, hole transporting layer, light emitting layer, electron transporting layer, and electron injection layer are included in the EL layer.

In a light emitting device of the present invention, how screen display is driven is not particularly limited. For example, a dot-sequential driving method, a linear-sequential driving method, a plane-sequential driving method or the like can be employed. Typically, a linear-sequential driving method is employed and a time ratio gray scale driving method or an area ratio gray scale driving method is chosen suitably. A video signal inputted to a source line of the light emitting device may be an analog signal or a digital signal, and driving circuits and other circuits are designed in accordance with the type of the video signal as appropriate.

BRIEF DESCRIPTION OF THE DRAWINGS

In the accompanying drawings:
FIGS. 5A to 5C are diagrams showing Embodiment Mode 2;
FIGS. 9A and 9B are diagrams showing Embodiment 3.

DETAILED DESCRIPTION OF THE PREFERRED EMBODIMENTS

Figure 1A:
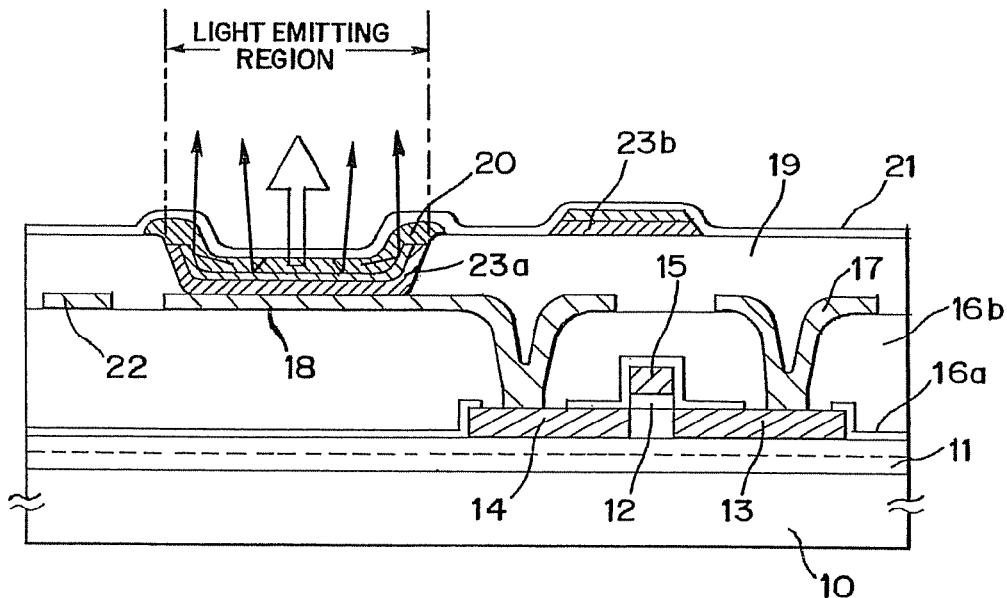
FIGS. 1A to 1C are diagrams showing Embodiment Mode 1.

Embodiment Modes of the present invention will be described below.
Embodiment Mode 1
FIG. 1A is a cross-sectional view of an active matrix light emitting device (a part of one pixel). Described here as an example is a light emitting element which uses as its light emitting layer a light emitting layer comprising an organic material formed of a high molecular weight material that emits white light.

In FIG. 1A, a TFT (p-channel TFT) on a substrate 10 having an insulating surface is an element for controlling a current flowing into an EL layer (organic compound-containing layer) 20 that emits white light. Of regions denoted by 13 and 14, one is a source region and the other is a drain region. A base insulating film 11 (here, a laminate of an insulating nitride film as a lower layer and an insulating oxide film as an upper layer) is formed on the substrate 10. A gate insulating film 12 is placed between a gate electrode 15 and an active layer of the TFT.

For a substrate 10 having an insulating surface, a glass substrate, a quartz substrate, and a plastic substrate may be chosen, as well as a semiconductor substrate for releasing heat of an EL element can be used.

Denoted by 16a is an interlayer insulating film formed of a silicon nitride film or a silicon nitroxide film. Reference symbol 16b is formed of a planarizing insulating film made from photosensitive or nonphotosensitive organic materials (polyimide, acryl, polyamide, polyimideamide, resist, or benzocyclobutene), a planarizing insulating film (that includes coating silicon oxide film, PSG (glass doped phosphorous), BPSG (glass doped boron and phosphorous)), or a laminated film having these films.

Although not shown in the drawing, one pixel has another or more TFTs (n-channel TFTs or p-channel TFTs) other than this TFT. The TFT here has one channel formation region. However, the number of channel formation regions is not particularly limited, and the TFT may have more than one channels.

Reference symbol 18 denotes layer of a first electrode that is connected to a source region and a drain region of the TFT. Here, reference symbol 18 is a laminated film layered a titanium film, a titanium nitride film, a film mainly containing aluminum, and a titanium nitride film in this order. A power supplying line 17 is formed to have the same laminate structure. Since the above laminate structure includes a film mainly containing aluminum, a low-resistant wiring is obtained and a source wiring 22 and others are formed at the same time.

Both end portions of the first electrode 18 and in-between areas are covered with an insulating material 19 (also called as a barrier or a bank). In the present invention, what sectional shape the insulating material 19 takes is important. If an upper edge portion of the insulating material 19 is not curved, a film formation defect is likely to occur and a convex portion is formed on the upper edge of the insulating material 19. Therefore, the present invention make an upper edge portion of the insulating material 19 curved to have a radius of curvature. The radius of curvature is preferably 0.2 to 3 µm. The present invention can give the light emitting layer comprising the organic material and the metal film excellent coverage. The taper angle in the side face of the insulating material 19 may be 45°±10°.

Reference 23a is a second electrode formed of a conductive film, namely, an anode (or a cathode) of OLED, and reference 21 is a third electrode, namely, a cathode of OLED (or an anode).

Further, after the insulating material 19 that is curved to have a radius of curvature is, formed, a second electrode 23a an auxiliary electrode 23b are formed. Depending on the curved surface of the insulating material 19, the concave shape of the second electrode 23a is obtained. The bottom surface of the second electrode 23a may be leveled. The radius of curvature of the second electrode 23a is preferably 0.2 to 3 µm. The present invention can give the light emitting layer comprising the organic material and the metal film excellent coverage. The taper angle in the slant of the second electrode 23a may be 45°±10° as well as that of the insulating material 19.

The present invention is characterized in that light emitted from the light emitting layer comprising the organic material 20 is reflected at the slant of the second electrode 23a to increase the total amount of light taken out in the direction indicated by the arrow in FIG. 1A.

Here, the second electrode 23a is formed of a laminated film layered a film mainly containing aluminum and a titanium nitride film in this order, and made top layer of 23a that is in contact with a light emitting layer comprising an organic material 20 function as an anode. A material layer that reflects light generated at the light emitting layer comprising the organic material 20 is used for the second electrode 23a. Here, light emission is reflected by the film mainly containing aluminum by reducing the thickness of the titanium nitride film less than 100 nm. An auxiliary electrode 23b is formed to have the same laminate structure. In addition, the auxiliary electrode 23b is provided for reducing a resistance of a conductive film (cathode) 21, however, if the electrical resistance of the conductive film 21 is sufficiently low, the auxiliary electrode 23b is not necessary to be provided.

To make the light emitting layer comprising the organic material 20 emit white light, an aqueous solution of poly (ethylene dioxythiophene)/poly(styrene sulfonic acid) (PEDOT/PSS) is applied to the entire surface and baked to form a film that works as a hole injection layer. Then, a polyvinyl carbazole (PVK) solution doped with a luminescence center pigment (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6) is applied to the entire surface and baked to form a film that works as a light emitting layer. The solvent of PEDOT/PSS is water and PEDOT/PSS is not dissolved in an organic solvent. Accordingly, the hole injection layer does not go back to the melted state when PVK is applied thereon. Since PEDOT/PSS and PVK have different solvents, they are preferably formed into films in different film forming chambers. The light 25 emitting layer comprising the organic material 20 may instead be a single layer. In this case, a 1,3,4-oxadiazole derivative (PBD) capable of transporting electrons is dispersed in polyvinyl carbazole (PVK) capable of transporting holes. Another method to obtain white light emission is to disperse 30 wt % of PBD as an electron transporting agent and disperse four kinds of pigments (coumarin 6, DCM1, and Nile red) in appropriate amounts.

Alternatively, a combination of films is chosen appropriately from a organic compound-containing layer that emits red light, a organic compound-containing layer that emits green light, and a organic compound-containing layer that emits blue light to overlap each other and mix their colors, thereby obtaining white light emission.

Further, an example of white light emission is shown here, however, it is not limited thereof. An organic compound-containing film that emits red emission, an organic compound-containing film that emits blue emission, and an organic compound-containing film that emits green emission may be properly and selectively formed for each pixel to realize full color display.

Figure 1B:
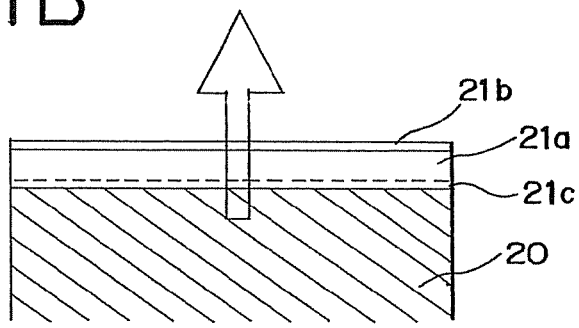

FIG. 1B is a view showing an enlarged frame format of a vicinity of an interface between the light emitting layer comprising the organic material 20 and the conductive film (third electrode) 21. Here, a laminated layer of a cathode buffer layer 21c and a conductive film 21a is referred to as a cathode. For the cathode buffer layer 21c, a small work function thin film, for example, a LiF or a $CaF_2$ is formed by evaporation to have a thickness of 1 to 10 nm, and a film mainly containing aluminum (Al film, AlLi film, AlMg film, or the like) is formed by sputtering or evaporation to have a thickness of about 10 nm to have function as the cathode. The material and thickness of the cathode have to be chosen suitably to transmit light from the light emitting layer comprising the organic material 20. In this specification, the term cathode includes not only a single layer of a material having a small work function but also a laminate of a thin film of a small work function material and a conductive film.

Using a film mainly containing aluminum (Al film) as the conductive film (third electrode) 21 means that a material that is not an oxide comes into contact with the light emitting layer comprising the organic material 20. As a result, the reliability of the light emitting device is improved. Instead of an Al film, a transparent conductive film (such as an ITO (indium oxide-tin oxide alloy) film, an $In_2O_3$—ZnO (indium oxide-zing oxide alloy) film, or a ZnO (zinc oxide) film) may be employed as the conductive film (third electrode) 21. The conductive film (third electrode) 21 may be a laminated film of a thin metal layer (typically a film of such alloy as MgAg, MgIn, or AlLi) and a transparent conductive film.

Figure 1C:
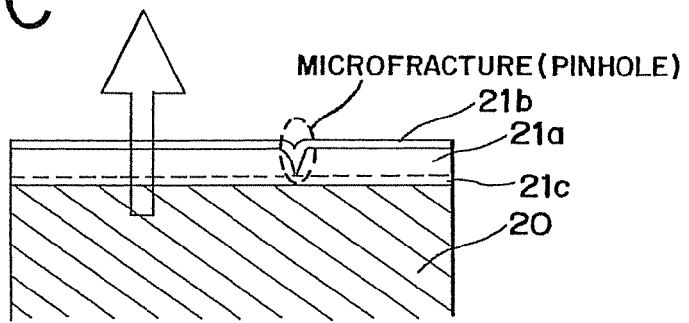

When a film mainly containing aluminum (Al film) is used as the conductive film (third electrode) 21, especially when a protective film containing oxygen (not shown) is formed thereon, an oxide film 21b is likely formed on the surface as shown in FIG. 1B, the oxide film 21b can improve the transmittancy of whole conductive film 21 as well as block the penetration of water and oxygen thereinto that causes deterioration. If a microfracture (also referred to as a pinhole) is formed on the conductive film 21 for some sort of causes, volume of the oxide film 21b increases and it can fill up the hole by reacting with oxygen as shown in FIG. 1C, further, it can block the penetration of moisture and oxygen into an EL layer.

Although not shown in the drawing, a protective film is preferably formed on the conductive film (third electrode) 21 in order to enhance the reliability of the light emitting device. This protective film is an insulating film which mainly contains silicon nitride or silicon nitroxide and which is formed by sputtering (the DC method or the RF method), or a thin film mainly containing carbon. A silicon nitride film can be formed in an atmosphere containing nitrogen and argon using a silicon target. A silicon nitride target may be employed instead. The protective film may also be formed by film forming apparatus that uses remote plasma. The protective film is made as thin as possible to allow emitted light to pass through the protective film. In the case that the film mainly containing aluminum is used as the conductive film 21, even if an insulating film containing oxygen is used as a protective film, the penetration of water and oxygen into an EL layer can be blocked.

The present invention is characterized in that the thin film mainly containing carbon is a DLC (diamond-like carbon) film with a thickness of 3 to 50 nm. In viewpoint of short-range order, a DLC film has $SP^3$ bonds as bonds between carbons. Macroscopically, a DLC film has an amorphous structure. 70 to 95 atomic % carbon and 5 to 30 atomic % hydrogen constitute a DLC film, giving the film high degree of hardness and excellent insulating ability. Such DLC film is characteristically low in transmittance of gas such as steam and oxygen. Also, it is known that the hardness of a DLC film is 15 to 25 GPa according to measurement by a microhardness tester.

A DLC film is formed by plasma CVD (typically, RF plasma CVD, microwave CVD, or electron cyclotron resonance (ECR) CVD) or sputtering. Any of the film formation methods can provide a DLC film with excellent adhesion. In forming a DLC film, the substrate is set as a cathode. Alternatively, a dense and hard DLC film is formed by applying negative bias and utilizing ion bombardment to a certain degree.

Reaction gases used to form the film are hydrogen gas and hydro carbon-based gas (for example, $CH_4$, $C_2H_2$, or $C_6H_6$) and are ionized by glow discharge. The ions are accelerated to collide against the cathode to which negative self-bias is applied. In this way, a dense, flat, and smooth DLC film is obtained. The DLC film is an insulating film transparent or translucent to visible light.

In this specification, being transparent to visible light means having a visible light transmittance of 80 to 100% whereas being translucent to visible light means having a visible light transmittance of 50 to 80%.

The description given here takes a top gate TFT as an example. However, the present invention is applicable to any TFT structure. For instance, the invention can be applied to a bottom gate (reverse stagger) TFT and a forward stagger TFT.

Embodiment Mode 2

A method of combining a white color luminescent element and a color filter (hereinafter, referred to as color filter method) will be explained in reference to FIG. 5A as follows.

The color filter method is a system of forming a light emitting element having a light emitting layer comprising an organic material displaying white color luminescence and passing the provided white color luminescence through a color filter to thereby achieve luminescence of red, green, and blue.

Although there are various methods of achieving white color luminescence, a case of using a luminescent layer comprising a high molecular material formable by application will be explained here. In this case, doping of a color pigment to the high molecular material for constituting a luminescent layer can be carried out by preparing a solution and can extremely easily be achieved in comparison with a vapor deposition method for carrying out common vapor deposition for doping a plurality of color pigments.

Specifically, after coating and baking an aqueous solution of poly(ethylenedioxythiophene)/poly(stylenesulfonic acid) (PEDOT/PSS) operated as a hole injecting layer over an entire face of an anode comprising a metal having large work function (Pt, Cr, W, Ni, Zn, Sn, In), thereafter coating and baking a polyvinyl carbazole (PVK) solution doped with a luminescent core pigment (1,1,4,4-tetraphenyl 1,3-butadiene (TPB), 4-dicyanomethylene-2-methyl-6-(p-dimethylaminostyryl)-4H-pyran (DCM1), Nile red, coumarin 6 or the like) operating as the luminescent layer over the entire face, a cathode comprising a laminated layer of a thin film including metal having small work function (Li, Mg, Cs) and a transparent conductive film (ITO (indium oxide tin oxide alloy), indium oxide zinc oxide alloy ($In_2O_3$—ZnO), zinc oxide (ZnO) or the like) laminated thereabove is formed. Further, PEDOT/PSS uses water as a solvent and is not dissolved in an organic solvent. Therefore, even when PVK is coated thereabove, there is no concern of dissolving again. Further, kinds of solvents of PEDOT/PSS and PVK differ from each other and therefore, it is preferable that the same film forming chamber is not used therefor.

Further, although an example of laminating organic compound-containing layers is shown in the above-described example, a single layer of a light emitting layer comprising an organic material can be constituted. For example, 1,3,4-oxadiazole derivative (PBD) having electron transporting performance may be dispersed in polyvinyl carbazole (PVK) having hole transporting performance. Further, white color luminescence is achieved by dispersing 30 wt % of PBD as an electron transporting agent and dispersing pertinent amounts of four kinds of color pigments (TPB, coumarin 6, DCM1, Nile red).

Further, the light emitting layer comprising the organic material is formed between the anode and the cathode and by recombining holes injected from the anode and electrons injected from the cathode at the light emitting layer comprising the organic material, white color luminescence is achieved in the light emitting layer comprising the organic material.

Further, it is also possible to achieve white color luminescence as a whole by pertinently selecting a light emitting layer comprising an organic material for carrying out red color luminescence; a light emitting layer comprising an organic material for carrying out green color luminescence, and a light emitting layer comprising an organic material for carrying out blue color luminescence, and laminating the films to mix color.

The light emitting layer comprising the organic material formed as described above can achieve white color luminescence as a whole.

By forming color filters respectively provided with the coloring layer (R) for absorbing other than red color luminescence, a coloring layer (G) for absorbing other than green color luminescence, and the coloring layer (B) for absorbing other than blue color luminescence in a direction of carrying out white color luminescence by the light emitting layer comprising the organic material, white color luminescence from the light emitting element can respectively be separated to achieve red color luminescence, green color luminescence, and blue color luminescence. Further, in the case of an active matrix type, a structure in which TFT is formed between the substrate and the color filter is constituted.

Further, starting from simplest stripe pattern, skewed mosaic alignment, triangular mosaic alignment, RGBG four pixels alignment or RGBW four pixels alignment can be used for the coloring layer (R, G, B).

A coloring layer for constituting a color filter is formed by using a color resist comprising an organic photosensitive material dispersed with a pigment. Further, chromaticity coordinates of white color luminescence are (x, y)=(0.34, 0.35). It is known that color reproducing performance as full color is sufficiently ensured.

Further, in this case, even when achieved luminescent color differs, the constitution is formed with all the light emitting layer comprising the organic materials displaying white color luminescence and therefore, it is not necessary to form the light emitting layer comprising the organic material to coat to divide for each luminescent color. Further, a polarizer for a circularly polarized light for preventing mirror reflection is not particularly needed.

Next, a CCM (color changing mediums) method realized by combining a blue color light emitting element having a blue color luminescent organic compound-containing layer and a fluorescent color changing layer will be explained in reference to FIG. 5B.

According to the CCM method, the fluorescent color changing layer is excited by blue color luminescence emitted from the blue color luminescent element and color is changed by each color changing layer. Specifically, changing from blue color to red color by the color changing layer (B→R), changing from blue color to green color by the color changing layer (B→G) and changing from blue color to blue color by the color changing layer (B→B) (further, changing from blue color to blue color may not be carried out) are carried out to achieve red color, green color and blue color luminescence. Also in the case of the CCM method, the structure in which TFT is formed between the substrate and the color changing layer is constituted in the case of the active matrix type.

Further, also in this case, it is not necessary to form the light emitting layer comprising the organic materials to coat to divide also in this case. Further, a polarizer for a circularly polarized light for preventing mirror reflection is not particularly needed.

Further, when the CCM method is used, since the color changing layer is florescent, the color changing layer is excited by external light and a problem of reducing contrast is posed and therefore, as shown by FIG. 5C, the contrast may be made conspicuous by mounting color filters.

Further, this embodiment mode can be combined with Embodiment Mode 1.

Embodiment Mode 3

Figure 4A:
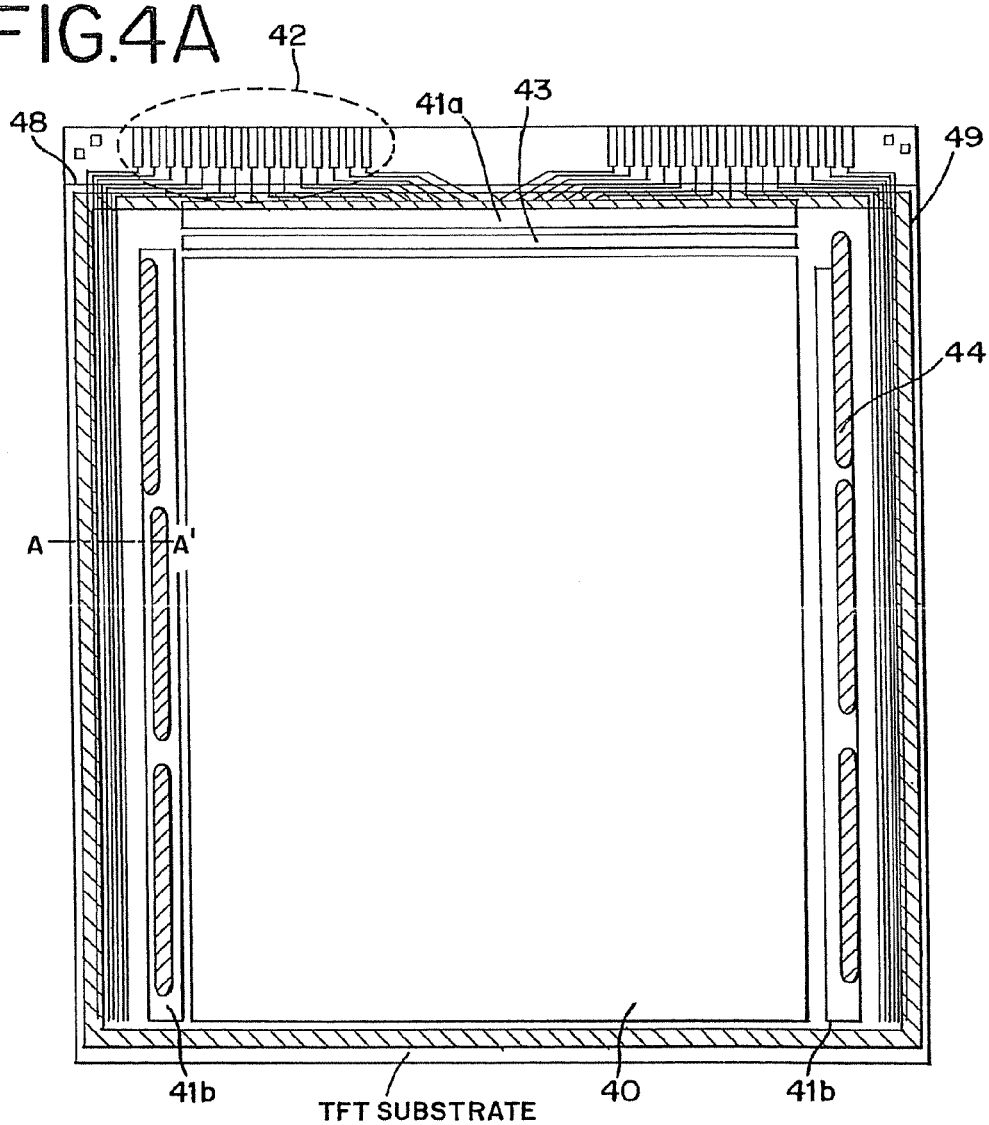
FIGS. 4A to 4C are diagrams showing Embodiment Mode 3.
Figure 4B:
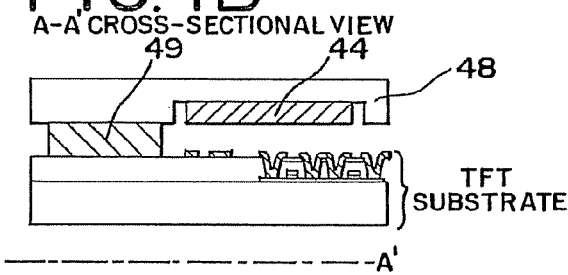

Here, a total of an EL module and arrangement of a drying agent will be explained in reference to FIGS. 4A and 4B. FIG. 4A is a top surface view of the EL module. FIG. 4B is a part of a cross-sectional view.

Figure 4C:
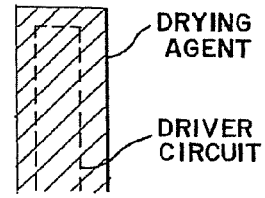

A substrate provided with numerous TFTs (also referred to as TFT substrate) is provided with a pixel portion 40 for display, driver circuits 41a and 41b for driving respective pixels of the pixel portion, a connecting portion for connecting the electrode provided over the EL layer and an extended wiring, a terminal portion 42 for pasting FPC for connecting to outside circuit and a drying agent 44. Further, in FIG. 4A and FIG. 4B, the drying agent 44 may be arranged to overlap a portion of the driver circuits, however, the drying agent can also be arranged such that a total of the driver circuits is concealed by the drying agent 44 as shown in FIG. 4C. Further, the constitution is hermetically sealed by the substrate for sealing the EL element and a seal member 49. Further, FIG. 4B is a cross-sectional view of FIG. 4A taken along a dotted line A-A'.

Pixels are numerously arranged regularly at the pixel portion 40 and arranged in an order of R, G, B in X direction although not illustrated here.

Further, as shown by FIG. 4B, the seal substrate 48 is pasted by the seal member 49 to maintain an interval of about 2 to 30 μm and all of the light emitting elements are hermetically sealed. A recessed portion is formed at the seal substrate 48 by sand blast method or the like and the recessed portion is arranged with the drying agent. Further, the seal member 49 is preferably constituted by a narrow frame formation to overlap a portion of the driver circuits. Degassing is preferably carried out by carrying out annealing in vacuum immediately before pasting the seal substrate 48 by the seal member 49. Further, when the seal substrate 48 is pasted, the pasting is preferably carried out under an atmosphere including an inert gas (rare gas or nitrogen).

Further, this embodiment mode can freely be combined with Embodiment Mode 1 or Embodiment Mode 2.

The present invention is described in more detail with the following Embodiments.

Embodiment 1

In this embodiment, a brief description is given with reference to FIGS. 2A to 3B on an example of procedure of forming a light emitting element in accordance with the present invention.

First, a base insulating film 31 is formed on a substrate 30 which has an insulating surface. The base insulating film 31 is a laminate and the first layer is a silicon oxynitride film formed to have a thickness of 10 to 200 nm (preferably 50 to 100 nm) by plasma CVD using as reaction gas $SiH_4$, $NH_3$, and $N_2O$. Here, a silicon oxynitride film (composition ratio: Si=32%, O=27%, N=24%, H=17%) with a thickness of 50 nm is formed. The second layer of the base insulating film is a silicon oxynitride film formed to have a thickness of 50 to 200 nm (preferably 100 to 150 nm) by plasma CVD using as reaction gas $SiH_4$ and $N_2O$. Here, a silicon oxynitride film (composition ratio: Si=32%, O=59%, N=7%, H=2%) with a thickness of 100 nm is formed. Although the base insulating film 31 in this embodiment has a two-layer structure, a single layer or a laminate of more than two layers of the above insulating films may be employed instead.

Next, a semiconductor layer is formed on the base film. The semiconductor layer to serve as an active layer of the TFT is obtained by forming a semiconductor film that has an amorphous structure through a known method (sputtering, LPCVD, plasma CVD, or the like), subjecting the film to known crystallization treatment (laser crystallization, thermal crystallization, thermal crystallization using nickel or other catalysts, or the like), and then patterning the obtained crystalline semiconductor film into a desired shape. The thickness of the semiconductor layer is 25 to 80 nm (preferably 30 to 60 nm). The material of the crystalline semiconductor film is not limited but preferably is silicon, a silicon germanium alloy, or the like.

When laser crystallization is employed to form the crystalline semiconductor film, a pulse oscillation type or continuous wave excimer layer, YAG layer, or $YVO_4$ laser is used. Laser light emitted from one of such laser oscillators is collected by an optical system into a linear shape before irradiating the semiconductor film. Crystallization conditions are chosen to suit individual cases. However, when an excimer layer is employed, the pulse oscillation frequency is 30 Hz and the laser energy density is 100 to 400 $mJ/cm^2$ (typically 200 to 300 $mJ/cm^2$). When a YAG laser is employed, the second harmonic thereof is used, the pulse oscillation frequency is 1 to 10 kHz, and the laser energy density is 300 to 600 $mJ/cm^2$ (typically 350 to 500 $mJ/cm^2$). The laser light is collected to have a width of 100 to 1000 μm, for example, 400 μm, into a linear shape and the entire surface of the substrate is irradiated with this linear laser light setting the laser light overlap ratio to 80 to 98%.

Next, the surface of the semiconductor layer is washed with an etchant containing hydrofluoric acid to form a gate insulating film that covers the semiconductor layer. The gate insulating film is an insulating film containing silicon and is formed by plasma CVD or sputtering to have a thickness of 40 to 150 nm. In this embodiment, a silicon oxynitride film (composition ratio: Si=32%, O=59%, N=7%, H=2%) is formed by plasma CVD to have a thickness of 115 nm. The gate insulating film is not limited to the silicon oxynitride film, of course, but may be a single layer or laminate of other insulating films that contain silicon.

The surface of the gate insulating film is washed and then a gate electrode is formed.

Next, the semiconductor layer is appropriately doped with an impurity element that imparts a semiconductor the p-type conductivity, here, boron (B), to form a source region and a drain region 32. After the doping, the semiconductor layer is subjected to heat treatment, irradiation of intense light, or laser light irradiation in order to activate the impurity element. At the same time the impurity element is activated, plasma damage to the gate insulating film and plasma damage to the interface between the gate insulating film and the semiconductor layer are repaired. It is particularly effective to activate the impurity element by irradiating the substrate from the front or back with the second harmonic of a YAG laser at room temperature to 300° C. A YAG laser is a preferable activation measure because it requires little maintenance.

An interlayer insulating film 33 from a silicon nitride film and silicon nitroxide film is formed by PCVD method. Then, an interlayer insulating film 35 is formed using a planarizing insulating film made from photosensitive or nonphotosensitive organic materials formed by application (polyimide, acryl, polyamide, polyimideamide, resist, or benzocyclobutene), or a planarizing insulating film made from inorganic materials (an applied silicon oxide film), PSG (phosphorus-doped glass), BPSG (glass doped with boron and phosphorus), or the like), or laminated film having these films.

After hydrogenation is conducted, contact holes reaching the source region or drain region are formed. Then, a source electrode (wiring) and a first electrode (drain electrode) are formed to complete the TFT (p-channel TFT).

Although the description in this embodiment uses a p-channel TFT, an n-channel TFT can be formed if an n-type impurity element (such as P or As) is used instead of a p-type impurity element.

The description given in this embodiment takes a top gate TFT as an example. However, the present invention is applicable to any TFT structure. For instance, the invention can be applied to a bottom gate (reverse stagger) TFT and a forward stagger TFT.

Figure 3A:
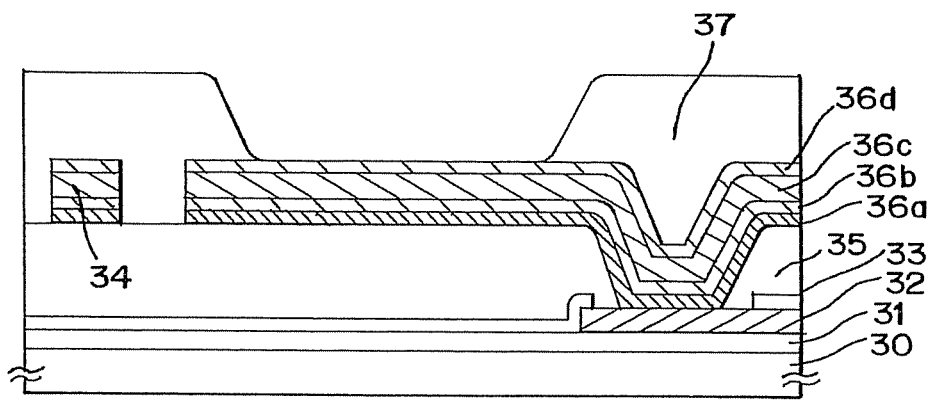
FIGS. 3A and 3B are diagrams showing Embodiment 1.

Formed through the above steps are the TFT (only the drain region 32 is shown in the drawing), the interlayer insulating films 33, 35, and the first electrodes 36a to 36d (FIG. 3A).

The first electrodes 36a to 36d in this embodiment are each a film mainly containing an element selected from the group consisting of Ti, TiN, TiSi$_x$N$_y$, Al, Ag, Ni, W, WSi$_x$, WN$_x$, WSi$_x$N$_y$, Ta, TaN$_x$, TaSi$_x$N$_y$, NbN, Mo, Cr, Pt, Zn, Sn, In, and Mo, or a film mainly containing an alloy or compound material of the above elements, or a laminate of these films. The total thickness of the first electrodes 36a to 36d is set between 100 nm and 800 nm.

Particularly, the first electrode 36a that comes into contact with the drain region 32 is preferably formed of a material that can form an ohmic contact with silicon, typically titanium, and is given a thickness of 10 to 100 nm. For the first electrode 36c, a metal material reflective of light, typically, a metal material mainly containing Al or Ag, is preferred, and the thickness of the layer is 100 to 600 nm. The first electrode 36b also functions as a blocking layer for preventing the first electrode 36c and 36a from forming an alloy. For the first electrode 36d, a material capable of preventing oxidation and corrosion of the first electrode 36c and avoiding hillock or the like is preferred (typically a metal nitride such as TiN or WN), and the thickness of the layer is 20 to 100 nm.

The first electrode 36a to 36d can be formed at the same time other wirings, for example, a source wiring 34 and a power supplying line, are formed.

Figure 3B:
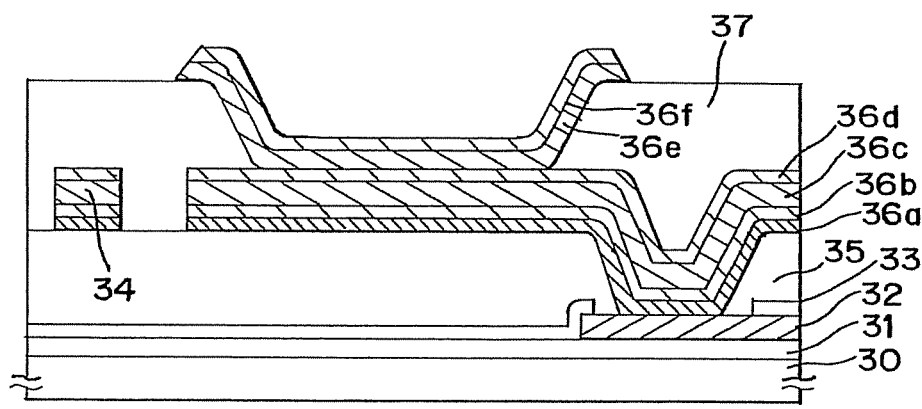

Next, the insulating material (called as a bank, a partition wall, a barrier, or the like) is formed to cover the edge of the first electrode (and a portion that is in contact with the drain region 32) (FIG. 3B). The insulating material is a film or a laminate of inorganic materials (such as silicon oxide, silicon nitride, and silicon oxynitride) and photosensitive or non-photosensitive organic materials (such as polyimide, acrylic, polyamide, polyimideamide, resist, and benzocyclobutene). Photosensitive organic resin is used in this embodiment. If positive photosensitive acrylic is used as a material of the insulating material, for example, it is preferable to curve only an upper edge portion of the insulating material to give a radius of curvature. Preferably, the final radius of curvature of the upper edge portion of the insulating material is 0.2 to 3 μm. A negative photosensitive material which becomes insoluble in an etchant under light and a positive photosensitive material which becomes soluble in an etchant under light both can be used for the insulating material.

The second electrodes 36e, 36f are formed. As shown in FIG. 3B, the second electrode is formed so as the center portion thereof to contact with the first electrode, the edge portion thereof to be on the insulating material 37, or side surface of the insulating material. The second electrodes 36e, 36f are slanted along with the side surface of the insulating material 37. The second electrode is slanted toward its center and that the angle of inclination (also called as a taper angle) of the slant is more than 30° and less than 70°. The second electrode 36e, 36f reflects light generated from a light emitting layer comprising an organic material that will be formed afterward.

The second electrodes 36e, 36f in this embodiment are each a film mainly containing an element selected from the group consisting of Ti, TiN, TiSi$_x$N$_y$, Al, Ag, Ni, W, WSi$_x$, WN$_x$, WSi$_x$N$_y$, Ta, TaN$_x$, TaSi$_x$N$_y$, NbN, Mo, Cr, Pt, Zn, Sn, In, and Mo, or a film mainly containing an alloy or compound material of the above elements, or a laminate of these films. The total thickness of the second electrodes 36e, 36f is set between 100 nm and 800 nm. The second electrodes 36e, 36f in this embodiment are formed by a laminated layer having high reflectance material film (Al film) 36e and a large work function metal thin film (TiN film) 36f, but it is not limited thereof. The electrode can be a single layer or a laminated layer having three or more layers.

In addition, in order to reduce the resistance of a third electrode that will be formed afterwards, an auxiliary electrode may be formed on the insulating material at the same time of the formation of the second electrode.

Next, a light emitting layer comprising an organic material (EL layer) 38 is formed by evaporation or application. When evaporation is chosen, for example, a film forming chamber is vacuum-exhausted until the degree of vacuum reaches $5 \times 10^{-3}$ Torr (0.665 Pa) or less, preferably $10^{-4}$ to $10^{-6}$ Pa, for evaporation. Prior to evaporation, the organic compound is vaporized by resistance heating. The vaporized organic compound flies out to the substrate as the shutter is opened for evaporation. The vaporized organic compound flies upward and then deposits on the substrate through an opening formed in a metal mask. The light emitting layer comprising the organic materials are formed by evaporation so that the light emitting element as a whole emits white light.

For instance, an Alq$_3$ film, an Alq$_3$ film partially doped with Nile red which is a red light emitting pigment, an Alq$_3$ film, a p-EtTAZ film, and a TPD (aromatic diamine) film are layered in this order to obtain white light.

On the other hand, when the light emitting layer comprising the organic material is formed by application using spin coating, the layer after application is preferably baked by vacuum heating. For example, an aqueous solution of poly (ethylene dioxythiophene)/poly(styrene sulfonic acid) (PEDOT/PSS) is applied to the entire surface and baked to form a film that works as a hole injection layer. Then, a polyvinyl carbazole (PVK) solution doped with a luminescence center pigment (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6) is applied to the surface and baked.

Although the light emitting layer comprising the organic material is a laminate in the above example, a single-layer film may be used as the light emitting layer comprising the organic material. For instance, a 1,3,4-oxadiazole derivative (PBD) capable of transporting electrons is dispersed in polyvinyl carbazole (PVK) capable of transporting holes. Another method to obtain white light emission is to disperse 30 wt % of PBD as an electron transporting agent and disperse four kinds of pigments (TPB, coumarin 6, DCM1, and Nile red) in appropriate amounts. Also, the light emitting layer comprising the organic material may be a laminate of layers of high molecular weight material and layers of low molecular weight materials.

Figure 2A:
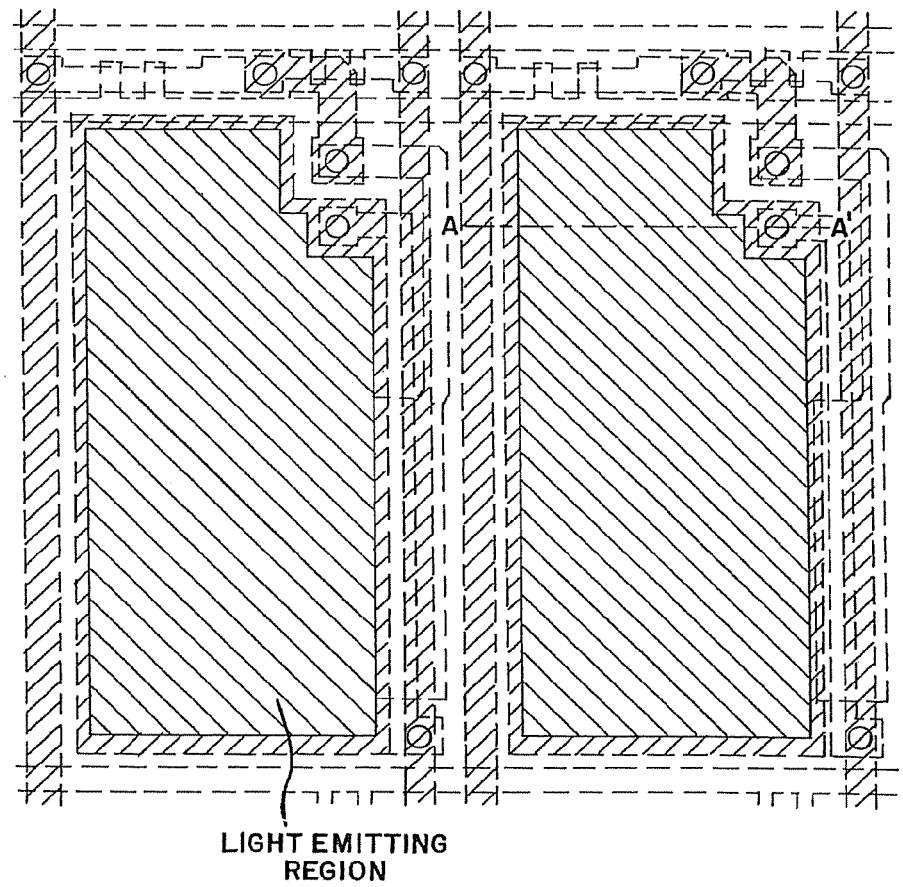
FIGS. 2A and 2B are diagrams showing Embodiment 1.
Figure 2B:
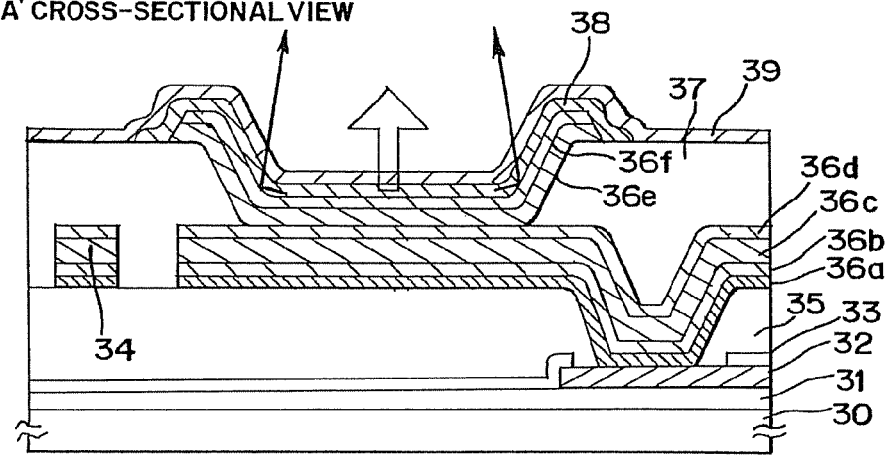

The next step is to form a thin film containing a metal of small function (a film of an alloy such as MgAg, MgIn, AlMg, LiF, AlLi, CaF$_2$, or CaN, or a film formed by co-evaporation of an element belonging to Group 1 or 2 in the periodic table and aluminum) and to form a thin conductive film (an aluminum film here) 39 thereon by evaporation (FIG. 2B). An aluminum film is highly capable of blocking moisture and oxygen and therefore is a preferable material of the conductive film 39 for improvement of the reliability of the light emitting device. FIG. 2B is a cross-sectional view taken along the dot-dash line A-A' in FIG. 2A. This laminate is thin enough to let emitted light pass and functions as the cathode in this embodiment. The thin conductive film may be replaced by a transparent conductive film (such as an ITO (indium oxide-tin oxide alloy) film, an In$_2$O$_3$—ZnO (indium oxide-zing oxide alloy) film, or a ZnO (zinc oxide) film). On the conductive film 39, an auxiliary electrode may be formed in order to lower the resistance of the cathode. The cathode is formed selectively by resistance heating through evaporation using an evaporation mask.

The thus obtained light emitting element emits white light in the direction indicated by the arrow in FIG. 2B. Light emitted in the lateral direction is reflected by the slant in the second electrodes 36f, 36e, thereby increasing the amount of light emitted in the arrow direction.

After the manufacturing process is thus finished up through formation of the second electrode (conductive film 39), the light emitting element formed on the substrate 30 is sealed by bonding a sealing substrate (transparent substrate) using a seal agent. Spacers formed of a resin film may be provided in order to keep the gap between the sealing substrate and the light emitting element. The space surrounded by the seal agent is filled with nitrogen or other inert gas. For the seal agent, an epoxy-based resin is preferred. Desirably, the material of the seal agent transmits as little moisture and oxygen as possible. A substance having an effect of absorbing oxygen and moisture (e.g., drying agent) may be placed in the space surrounded by the seal agent.

By enclosing the light emitting element in a space as above, the light emitting element can be completely cut off from the outside and external substances that accelerate degradation of the light emitting layer comprising the organic material, such as moisture and oxygen, can be prevented from penetrating into the light emitting element. Accordingly, a highly reliable light emitting device is obtained.

Embodiment 2

This embodiment describes with reference to FIGS. 6A to 8 an example of a light emitting device in which an auxiliary electrode is formed.

Figure 6A:
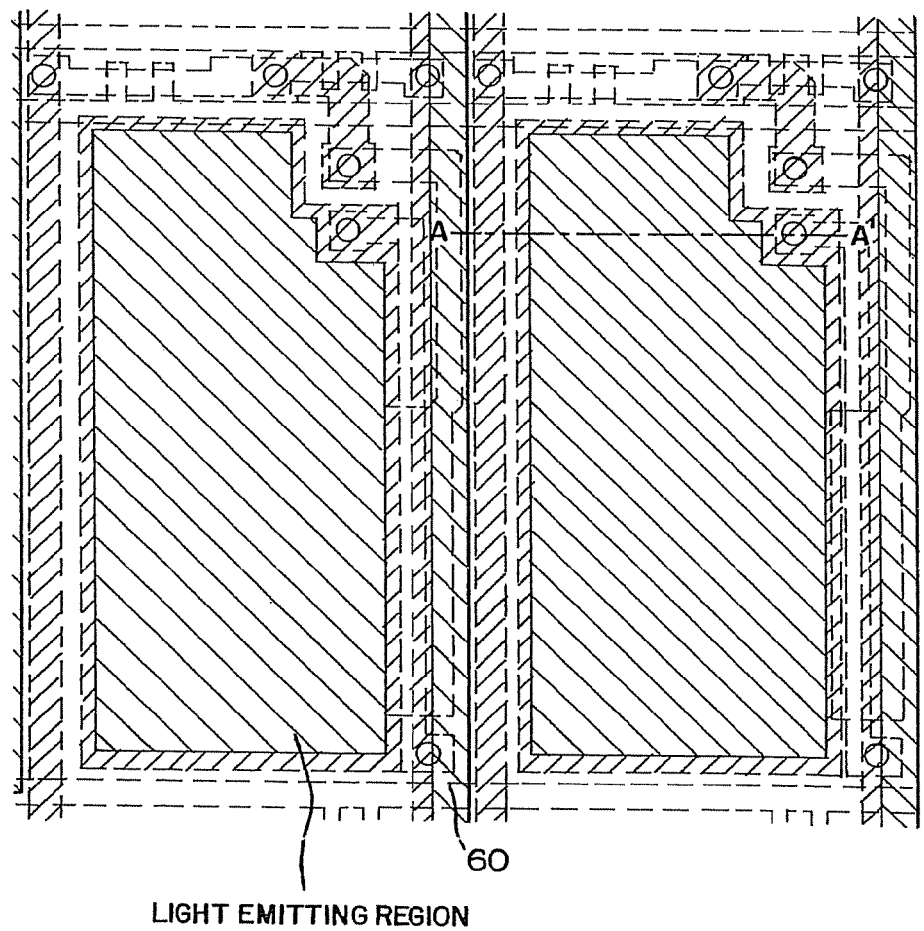
FIGS. 6A and 6B are diagrams showing Embodiment 2.
Figure 6B:
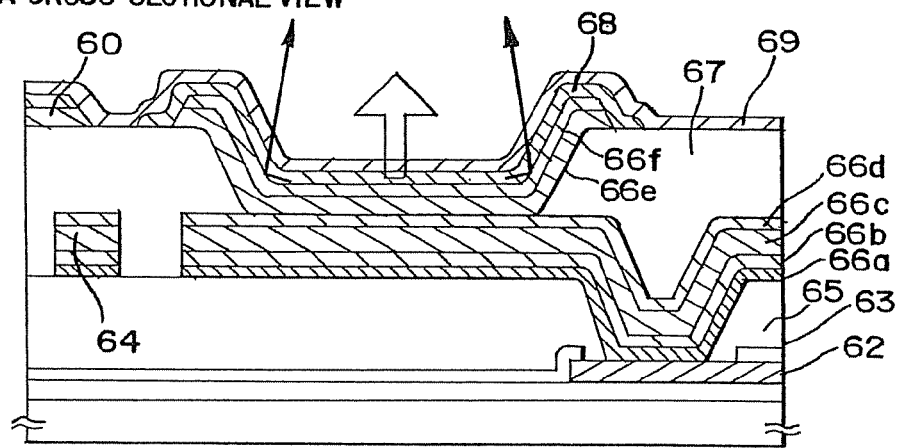

FIG. 6A is a top view of a pixel, FIG. 6B is and a cross-sectional view taken along the dot-dash line A-A'.

In this embodiment, steps up through formation of an insulating material 67 are identical with those in Embodiment 1 and descriptions thereof are omitted here. The insulating material 37 in FIG. 2B corresponds to the insulating material 67 in FIG. 6B.

Following the descriptions in Embodiment 1, a base insulating film, a drain region 62, interlayer insulating films 63, 65, first electrode 66a to 66d, and the insulating material 67 are formed on a substrate having an insulating surface.

Next, the second electrodes 66e, 66f having curved portion are formed, and a light emitting layer comprising an organic material (EL layer) 68 is selectively formed. This embodiment employs evaporation using an evaporation mask or ink jet to selectively form the light emitting layer comprising the organic material 68.

Figure 7:
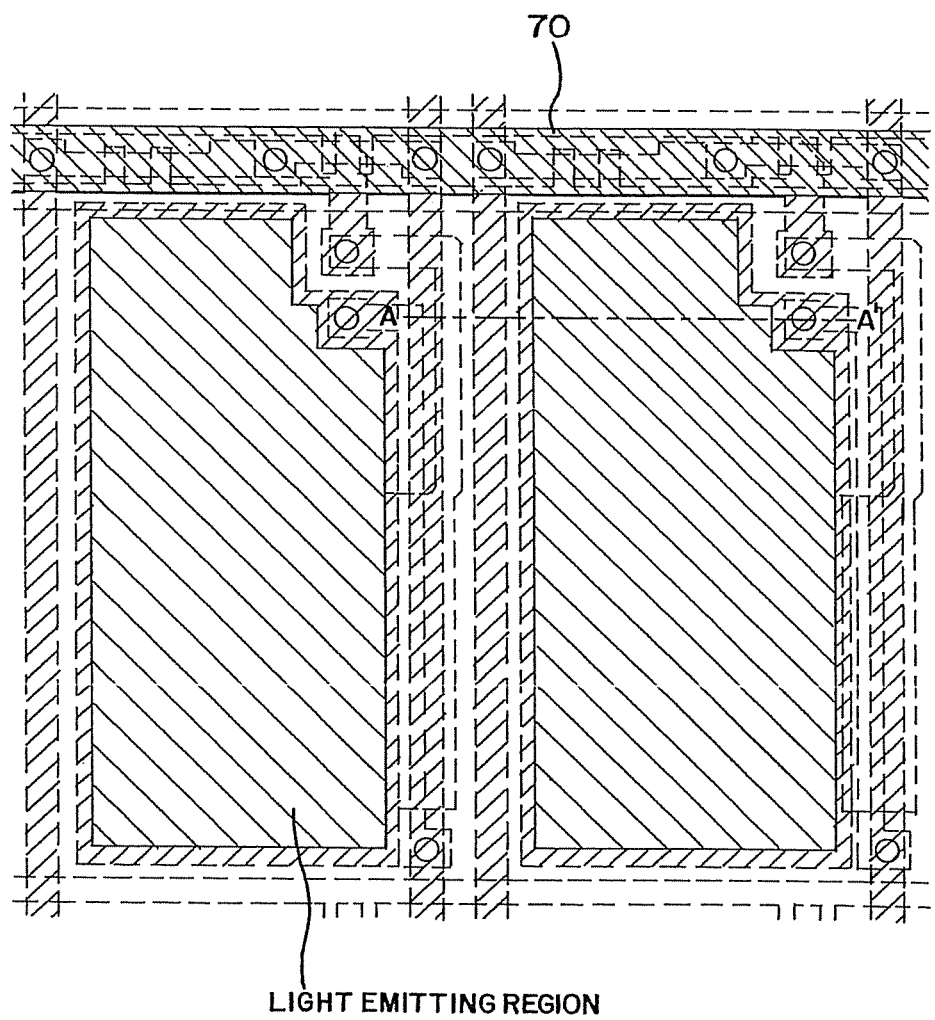
FIG. 7 is a diagram showing Embodiment 2.

Then, an auxiliary electrode 60 is selectively formed on the insulating material 67 by evaporation using an evaporation mask. In the example given in this embodiment, the auxiliary electrode 60 is placed in the direction Y as shown in FIG. 6A. However, arrangement of the auxiliary electrode is not particularly limited and, as shown in FIG. 7, an auxiliary electrode 70 placed in the direction X may be employed. A cross-sectional view taken along the dot-dash line A-A' in FIG. 7 is identical with FIG. 2B.

Figure 8:
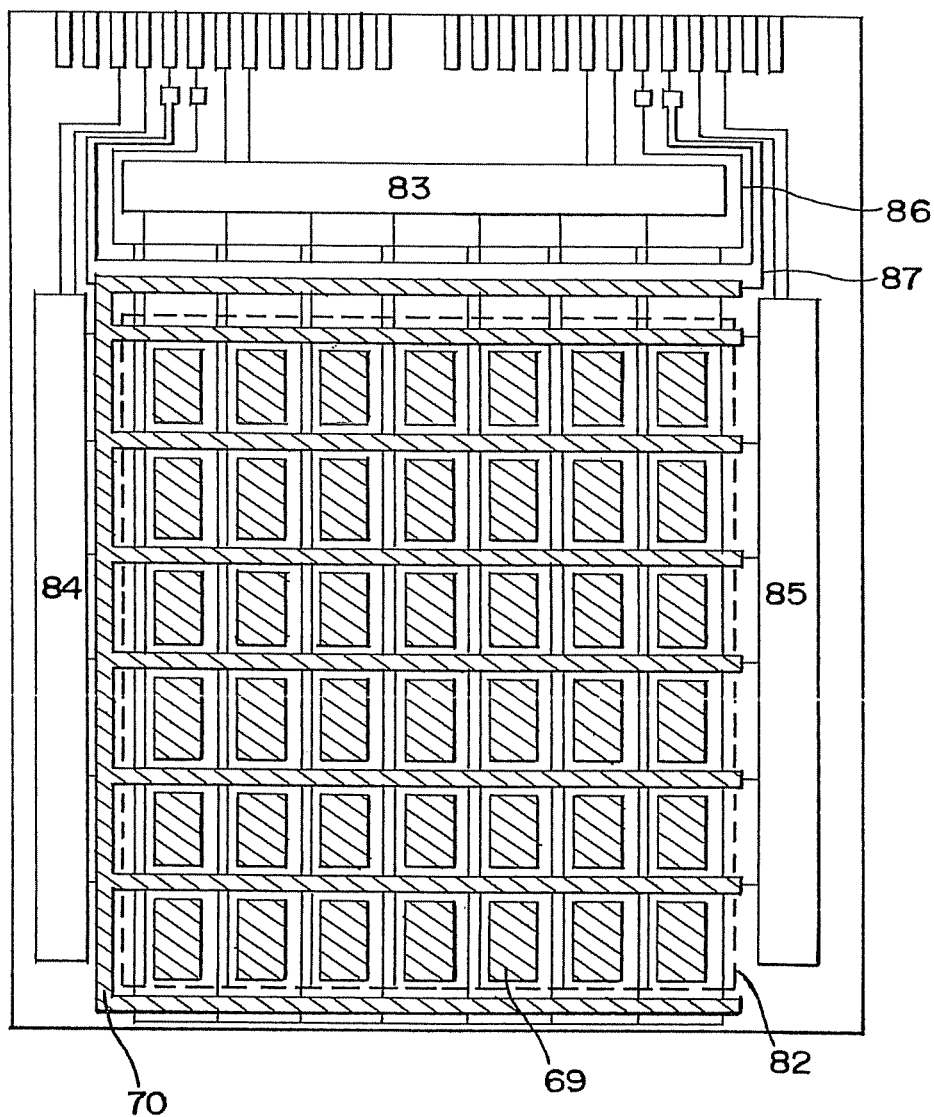
FIG. 8 is a diagram showing Embodiment 2.

FIG. 8 is an exterior diagram of the panel shown in FIG. 7. The auxiliary electrode (auxiliary wiring) 70 is led out as shown in FIG. 8 and comes into contact with a lead-out wiring 87 in a region between a pixel portion 82 and a source side driving circuit 83. In FIG. 8, reference symbol 82 denotes the pixel portion, 83, the source side driving circuit, 84 and 85, gate side driving circuits, and 86, a power supplying line. The wirings that are formed at the same time the first electrode is formed are the power supplying line 86, the lead-out wiring 87, and a source wiring. In FIG. 8, a terminal electrode for connecting with an FPC is formed at the same time a gate wiring is formed.

Similarly to Embodiment 1, the next step is to form a thin film containing a metal of small function (a film of an alloy such as MgAg, MgIn, AlLi, CaF$_2$, or CaN, or a film formed by co-evaporation of an element belonging to Group 1 or 2 in the periodic table and aluminum) and to form a thin conductive film (an aluminum film here) 69 thereon by evaporation. This laminate is thin enough to let emitted light pass and functions as the cathode in this embodiment. The thin conductive film may be replaced by a transparent conductive film (such as an ITO (indium oxide-tin oxide alloy) film, an In$_2$O$_3$—ZnO (indium oxide-zing oxide alloy) film, or a ZnO (zinc oxide) film). In this embodiment, the auxiliary electrode 60 is formed on the insulating material 67 such that the auxiliary electrode 60 comes into contact with the conductive film 69 in order to lower the resistance of the cathode.

The thus obtained light emitting element emits white light in the direction indicated by the arrow in FIG. 6B. Light emitted in the lateral direction is reflected by the slant in the second electrodes 66e, 66f, thereby increasing the amount of light emitted in the arrow direction.

This embodiment is also applicable to a light emitting device having a large-sized pixel portion since the resistance of the cathode is lowered by forming the auxiliary electrode 60 or 70.

This embodiment can be combined freely with any one of Embodiment Modes 1 to 3 and Embodiment 1.

Embodiment 3

Further, an exterior view of an active matrix type light emitting apparatus is described with reference to FIGS. 9A and 9B. FIG. 9A is a top view showing the light emitting apparatus and FIG. 9B is a cross-sectional view of FIG. 9A taken along a line A-A'. Reference numeral 901 indicated by a dotted line designates a source signal line driver circuit, numeral 902 designates a pixel portion, and numeral 903 designates a gate signal line driver circuit. Further, numeral 904 designates a seal substrate, numeral 905 designates a seal agent and an inner side surrounded by the seal agent 905 constitutes a space 907. Reference numerals 930a, 930b are IC chips having a memory, a CPU, a D/A converter, or the like and mounted on a substrate 910 by COG (chip on glass) method, wire bonding method, or TAB (tape automated bonding) method.

Further, reference numeral 908 designates a wiring for transmitting signals inputted to the source signal line driver circuit 901 and the gate signal line driver circuit 903 for receiving a video signal or a clock signal from FPC (flexible printed circuit) 909 for constituting an external input terminal. Further, although only FPC is illustrated here, the FPC may be attached with a printed wiring board (PWB). The light emitting apparatus in the specification includes not only a main body of the light emitting apparatus but also a state in which FPC or PWB is attached thereto.

Next, a sectional structure will be explained in reference to FIG. 9B. Driver circuits and the pixel portion are formed over a substrate 910 and here, the source signal line driver circuit 901 as the driver circuit and the pixel portion 902 are shown.

Further, the source signal line driver circuit 901 is formed with a CMOS circuit combined with an n-channel type TFT 923 and a p-channel type TFT 924. Further, TFT for forming the driver circuit may be formed by a publicly known CMOS circuit, PMOS circuit or NMOS circuit. Further, although according to the embodiment, a driver integrated type formed with the driver circuits over the substrate is shown, the driver integrated type is not necessarily be needed and the driver circuits can be formed not over the substrate but at outside thereof.

Further, the pixel portion 902 is formed by a plurality of pixels each including a switching TFT 911, and a first electrode (anode) 913 electrically connected to the current control TFT 912 and a drain thereof.

Further, an insulating layer 914 is formed at both ends of the first electrode 913, a portion of the first electrode forms a slant along a side of the insulating layer 914. Light generated at a layer containing organic compound 915 is reflected by the slant in order to increase an amount of luminescence in the direction indicated by an arrow in FIG. 9B.

A light emitting layer comprising an organic material 915 is selectively formed on the second electrode (anode) 919. Further, a third electrode (cathode) 916 is formed over the light emitting layer comprising the organic material 915. Thereby, a light emitting element 918 comprising the second electrode (anode) 919, the light emitting layer comprising the organic material 915 and the third electrode (cathode) 916 is formed. Here, the light emitting element 918 shows an example of white color luminescence and therefore, provided with the color filter comprising a coloring layer 931 and a light shielding 932 (for simplification, overcoat layer is not illustrated here).

An auxiliary electrode 917 which is a part of a structure shown in Embodiment 2 is formed on the insulating layer 914 to realize that the third electrode has a lower resistance. The second electrode (cathode) 916 functions also as a wiring common to all the pixels and electrically connected to FPC 909 via the auxiliary electrode 917 and the connection wiring 908.

Further, in order to seal the light emitting element 918 formed over the substrate 910, the seal substrate 904 is pasted by the seal agent 905. Further, a spacer comprising a resin film may be provided for ensuring an interval between the seal substrate 904 and the light emitting element 918. Further, the space 907 on the inner side of the seal agent 905 is filled with an inert gas of nitrogen or the like. Further, it is preferable to use epoxy species resin for the seal agent 905. Further, it is preferable that the seal agent 905 is a material for permeating moisture or oxygen as less as possible. Further, the inner portion of the space 907 may be included with the substance having an effect of absorbing oxygen of water.

According to this embodiment, as a material for constituting the seal substrate 904, other than glass substrate or quartz substrate, a plastic substrate comprising FRP (Fiberglass-Reinforced Plastics), PVF (polyvinyl fluoride), Mylar, polyester or acrylic resin can be used. Further, it is possible to adhere the seal substrate 904 by using the seal agent 905 and thereafter seal to cover a side face (exposed face) by a seal agent.

By sealing the light emitting element in the space 907 as described above, the light emitting element can completely be blocked from outside and a substance for expediting to deteriorate the light emitting layer comprising the organic material such as moisture or oxygen can be prevented from penetrating from outside. Therefore, the highly reliable light emitting apparatus can be provided.

This embodiment can freely be combined with Embodiment Modes 1 to 3, and Embodiments 1, 2.

Embodiment 4

By implementing the present invention, all of electronic apparatus integrated with a module having an OLED (active matrix type EL module) are completed.

As such electronic apparatus, a video camera, a digital camera, a head mount display (goggle type display), a car navigation apparatus, a projector, a car stereo, a personal computer, a portable information terminal (mobile computer, portable telephone or electronic book) and the like are pointed out. FIGS. 10A to 11C show examples of these.

Figure 10A:
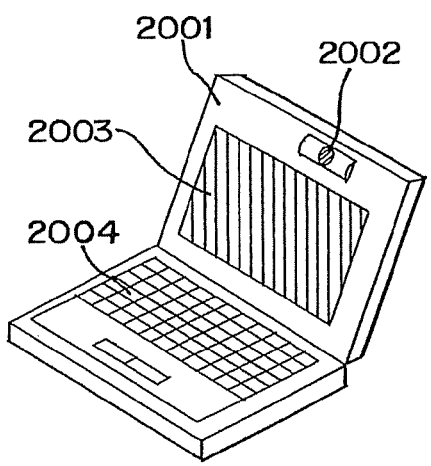
FIGS. 10A to 10F are diagrams showing examples of electronic equipments.

FIG. 10A is a personal computer which includes a main body 2001, an image input portion 2002, a display unit 2003 and a keyboard 2004.

Figure 10B:
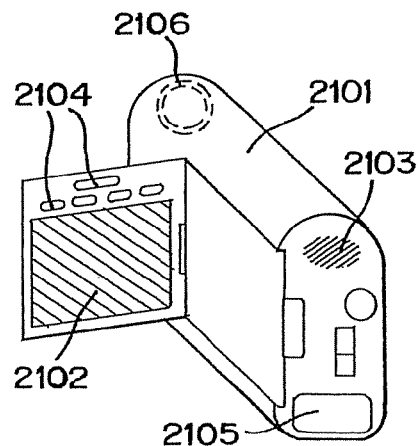

FIGS. 10B is a video camera which includes a main body 2101, a display unit 2102, a voice input portion 2103, an operation switch 2104, a battery 2105, an image receiving portion 2106.

Figure 10C:
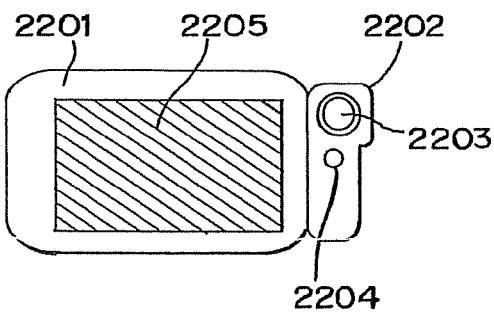

FIG. 10C is a mobile computer which includes a main body 2201, a camera portion 2202, an image receiving portion 2203, an operation switch 2204 and a display unit 2205.

Figure 10D:
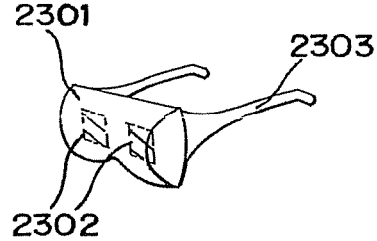

FIG. 10D is a goggle type display which includes a main body 2301, a display unit 2302 and an arm portion 2303.

Figure 10E:
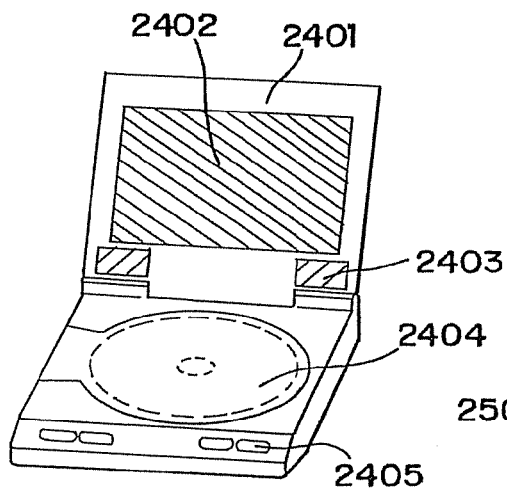

FIG. 10E is a player using a record medium recorded with programs (hereinafter, referred to as record medium) which includes a main body 2401, a display unit 2402, a speaker portion 2403, a record medium 2404 and an operation switch 2405. Further, the player uses DVD (Digital Versatile Disc) or CD as a record medium and can enjoy music, enjoy movie and carry out the game or Internet.

Figure 10F:
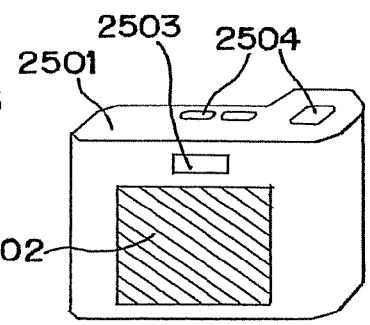

FIG. 10F is a digital camera which includes a main body 2501, a display unit 2502, an eye-piece portion 2503, an operation switch 2504 and an image receiving portion (not illustrated).

Figure 11A:
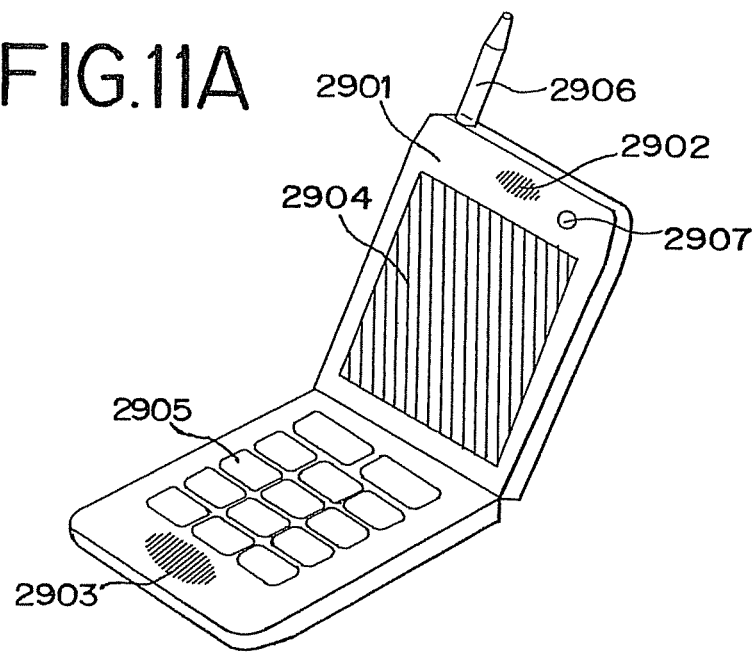
FIGS. 11A to 11C are diagrams showing examples of electronic equipments.

FIG. 11A is a portable telephone which includes a main body 2901, a voice output portion 2902, a voice input portion 2903, a display unit 2904, an operation switch 2905, an antenna 2906 and an image input portion (CCD, image sensor) 2907.

Figure 11B:
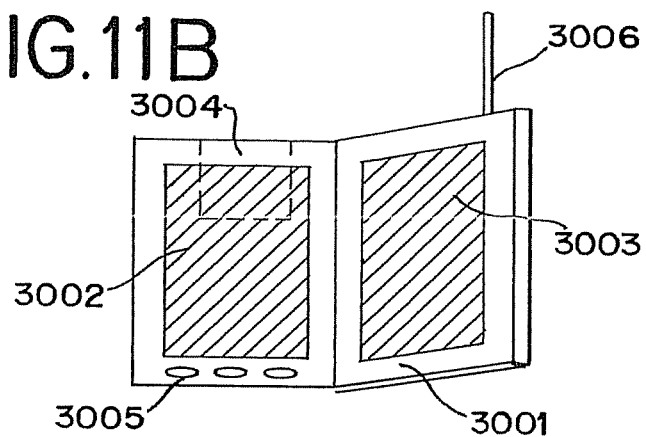

FIG. 11B is a portable book (electronic book) which includes a main body 3001, display units 3002, 3003, a record medium 3004, an operation switch 3005, an antenna 3006.

Figure 11C:
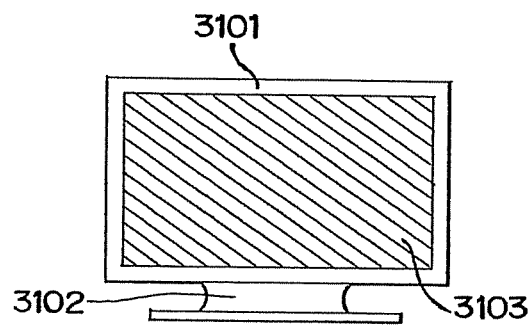

FIG. 11C is the display which includes a main body 3101, a support base 3102 and a display unit 3103.

Incidentally, the display shown in FIGS. 11C is of a screen size of middle or small type or large type, for example, a screen size of 5 to 20 inches. Further, in order to form the display unit of this size, it is preferable to use a display unit having a side of a substrate of 1 m and carry out mass production by taking many faces. In case that the screen having a size of middle or small type or large type is formed, it is preferable that the auxiliary electrode shown in Embodiment 2 or Embodiment 3 is formed.

As described above, a range of applying the invention is extremely wide and is applicable to a method of fabricating electronic apparatus of all the fields. Further, the electronic apparatus of the embodiment can be realized by using a constitution comprising any combination of Embodiment Modes 1 to 3 and Embodiments 1 to 3.

According to the present invention, a portion of light emitted from a light emitting layer comprising an organic material that is emitted in the lateral direction (the direction parallel to the substrate face) is reflected by a slant formed in a stepped portion of a second electrode to thereby increase the total amount of light taken out in a certain direction (a direction in which light passes the third electrode). In short, a light emitting device with less stray light and other types of light emission loss can be obtained.

What is claimed is:

1. A light emitting device comprising:
   a first electrode;
   an insulating material covering an end portion of the first electrode;
   a second electrode covering a side face of the insulating material and contacting with the first electrode;
   a light emitting layer comprising an organic material over the second electrode and the insulating material;
   a third electrode over the light emitting layer and the insulating material; and
   an auxiliary electrode in contact with the third electrode,
   wherein the auxiliary electrode comprises the same material as the second electrode, and
   wherein the second electrode is formed in a concave shape partially having a curved surface, and reflects a light emitted from the light emitting layer comprising the organic material.

2. A light emitting device according to claim 1,
   wherein the first electrode is the same in its electric potential as the second electrode, and is one of an anode and a cathode.

3. A light emitting device according to claim 1,
   wherein a center portion of the second electrode contacts with the first electrode, and
   wherein the insulating material exists between the end portion of the first electrode and an end portion of the second electrode.

4. A light emitting device according to claim 1,
   wherein the third electrode is a conductive film through which a light is transmitted.

5. A light emitting device according to claim 1,
   wherein the insulating material has in its upper end portion a curved surface possessing a radius of curvature, and the radius of curvature is 0.2 µm to 3 µm.

6. A light emitting device according to claim 1,
   wherein the insulating material has in its upper end portion a curved surface possessing a first radius of curvature and has in its lower end portion a curved surface possessing a second radius of curvature, and the first radius of curvature and the second radius of curvature are 0.2 µm to 3 µm.

7. A light emitting device according to claim 1,
   wherein the second electrode has a slant face, and its slant angle is 30° to 70°.

8. A light emitting device according to claim 1,
   wherein the light emitting layer comprising the organic material comprises one of a material emitting a red light, a material emitting a green light and a material emitting a blue light.

9. A light emitting device according to claim 1, wherein the light emitting layer comprising the organic material is a material emitting a monochromatic light, and is combined with a color changing layer.

10. A light emitting device according to claim 1, wherein the light emitting device is one of selected from the group consisting of a video camera, a digital camera, a goggle type display, a car navigation, a personal computer, a DVD player, an electronic game equipment and a portable information terminal.

11. A light emitting device according to claim 1,
    wherein the insulating material has in its upper end portion a curved surface.

12. A light emitting device according to claim 1,
    wherein the insulating material has in its upper end portion a curved surface and has in its lower end portion a curved surface.

13. A light emitting device according to claim 1,
    wherein the insulating material covers end portions of the first electrode.

14. A light emitting device according to claim 1,
    wherein the second electrode covers part of a top surface of the insulating material.

15. A light emitting device comprising:
    a first electrode;
    an insulating material covering an end portion of the first electrode;
    a second electrode covering a side face of the insulating material and contacting with the first electrode;
    a light emitting layer comprising an organic material over the second electrode and the insulating material;
    a third electrode over the light emitting layer and the insulating material; and
    an auxiliary electrode in contact with the third electrode,
    wherein the auxiliary electrode comprises the same material as the second electrode,
    wherein the second electrode is formed in a concave shape partially having a curved surface, and reflects a light emitted from the light emitting layer comprising the organic material, and wherein the light emitting layer comprising the organic material comprises a material emitting a white light, and is combined with a color filter.

16. A light emitting device according to claim 15, wherein the first electrode is the same in its electric potential as the second electrode, and is one of an anode and a cathode.

17. A light emitting device according to claim 15, wherein a center portion of the second electrode contacts with the first electrode, and wherein the insulating material exists between the end portion of the first electrode and an end portion of the second electrode.

18. A light emitting device according to claim 15, wherein the third electrode is a conductive film through which a light is transmitted.

19. A light emitting device according to claim 15, wherein the insulating material has in its upper end portion a curved surface possessing a radius of curvature, and the radius of curvature is 0.2 µm to 3 µm.

20. A light emitting device according to claim 15, wherein the insulating material has in its upper end portion a curved surface possessing a first radius of curvature and has in its lower end portion a curved surface possessing a second radius of curvature, and the first radius of curvature and the second radius of curvature are 0.2 µm to 3 µm.

21. A light emitting device according to claim 15, wherein the second electrode has a slant face, and its slant angle is 30° to 70 °.

22. A light emitting device according to claim 15, wherein the light emitting device is one of selected from the group consisting of a video camera, a digital camera, a goggle type display, a car navigation, a personal computer, a DVD player, an electronic game equipment and a portable information terminal.

23. A light emitting device according to claim 15, wherein the insulating material has in its upper end portion a curved surface.

24. A light emitting device according to claim 15, wherein the insulating material has in its upper end portion a curved surface and has in its lower end portion a curved surface.

25. A light emitting device according to claim 15, wherein the insulating material covers end portions of the first electrode.

26. A light emitting device according to claim 15, wherein the second electrode covers part of a top face of the insulating material.

27. A light emitting device comprising:
a first electrode connected to one of a source and a drain of a thin film transistor;
an insulating material covering an end portion of the first electrode;
a light emitting layer comprising an organic material over the first electrode and the insulating material; and
a second electrode over the light emitting layer and the insulating material,
wherein the insulating material has a curved surface possessing a first radius of curvature in its upper end portion and a curved surface possessing a second radius of curvature in its lower end portion, and the first radius of curvature and the second radius of curvature are 0.2 µm to 3 µm.

28. A light emitting device according to claim 27, wherein the first electrode is one of an anode and a cathode.

29. A light emitting device according to claim 27, wherein the second electrode is a conductive film through which a light is transmitted.

30. A light emitting device according to claim 27, wherein the insulating material has a slant face, and its slant angle is 30° to 70°.

31. A light emitting device according to claim 27, wherein the light emitting layer comprising the organic material comprises one of a material emitting a red light, a material emitting a green light and a material emitting a blue light.

32. A light emitting device according to claim 27, wherein the light emitting layer comprising the organic material is a material emitting a monochromatic light, and is combined with a color changing layer.

33. A light emitting device according to claim 27, further comprising an auxiliary electrode in contact with the second electrode.

34. A light emitting device according to claim 27, wherein the light emitting device is one of selected from the group consisting of a video camera, a digital camera, a goggle type display, a car navigation, a personal computer, a DVD player, an electronic game equipment and a portable information terminal.

35. A light emitting device according to claim 27, wherein the insulating material covers end portions of the first electrode.

36. A light emitting device comprising:
a first electrode connected to one of a source and a drain of a thin film transistor;
an insulating material covering an end portion of the first electrode;
a light emitting layer comprising an organic material over the first electrode and the insulating material; and
a second electrode over the light emitting layer and the insulating material,
wherein the insulating material has a curved surface possessing a first radius of curvature in its upper end portion and a curved surface possessing a second radius of curvature in its lower end portion, and the first radius of curvature and the second radius of curvature are 0.2 µm to 3 µm, and
wherein the light emitting layer comprising the organic material comprises a material emitting a white light, and is combined with a color filter.

37. A light emitting device according to claim 36, wherein the first electrode is one of an anode and a cathode.

38. A light emitting device according to claim 36, wherein the second electrode is a conductive film through which a light is transmitted.

39. A light emitting device according to claim 36, wherein the insulating material has a slant face, and its slant angle is 30° to 70°.

40. A light emitting device according to claim 36, further comprising an auxiliary electrode in contact with the second electrode.

41. A light emitting device according to claim 36, wherein the light emitting device is one of selected from the group consisting of a video camera, a digital camera, a goggle type display, a car navigation, a personal computer, a DVD player, an electronic game equipment and a portable information terminal.

42. A light emitting device according to claim 36, wherein the insulating material covers end portions of the first electrode.

* * * * *